United States Patent
Van Dal et al.

(10) Patent No.: US 12,538,525 B2
(45) Date of Patent: Jan. 27, 2026

(54) SEMICONDUCTOR DEVICE AND METHOD OF MANUFACTURING SEMICONDUCTOR DEVICE

(71) Applicant: TAIWAN SEMICONDUCTOR MANUFACTURING COMPANY LTD., Hsinchu (TW)

(72) Inventors: Marcus Johannes Henricus Van Dal, Linden (BE); Gerben Doornbos, Kessel-Lo (BE)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 436 days.

(21) Appl. No.: 17/748,106

(22) Filed: May 19, 2022

(65) Prior Publication Data

US 2023/0378372 A1    Nov. 23, 2023

(51) Int. Cl.
*H01L 21/02* (2006.01)
*H10D 30/67* (2025.01)
*H10D 99/00* (2025.01)

(52) U.S. Cl.
CPC ... *H10D 30/6757* (2025.01); *H01L 21/02565* (2013.01); *H10D 30/6729* (2025.01); *H10D 30/6734* (2025.01); *H10D 30/6755* (2025.01); *H10D 99/00* (2025.01)

(58) Field of Classification Search
CPC ......... H01L 29/78696; H01L 21/02565; H01L 29/41733; H01L 29/66969; H01L 29/78648; H01L 29/7869
USPC .......................................................... 257/401
See application file for complete search history.

(56) References Cited

U.S. PATENT DOCUMENTS

| | | | | |
|---|---|---|---|---|
| 5,637,898 A * | 6/1997 | Baliga | ................. | H01L 29/7813 257/330 |
| 7,592,670 B2 * | 9/2009 | Kim | ................. | H01L 29/66795 257/E21.442 |
| 8,304,841 B2 * | 11/2012 | Xu | ................. | H01L 21/823842 438/176 |
| 8,692,252 B2 * | 4/2014 | Takata | ................ | H01L 29/7869 438/151 |
| 8,735,949 B2 * | 5/2014 | Morizuka | ............ | H10D 62/328 257/256 |
| 9,166,021 B2 * | 10/2015 | Tezuka | .............. | H01L 21/28194 |
| 9,219,161 B2 * | 12/2015 | Yamazaki | ........... | H01L 29/7869 |
| 9,245,958 B2 * | 1/2016 | Yamazaki | .......... | H01L 29/7869 |
| 9,293,602 B2 * | 3/2016 | Yamazaki | ......... | H01L 29/78696 |
| 9,331,100 B2 * | 5/2016 | Yamazaki | ........... | H01L 29/7869 |
| 9,337,344 B2 * | 5/2016 | Hanaoka | ................ | H01L 29/045 |
| 9,373,711 B2 * | 6/2016 | Yamazaki | ............... | H01L 29/78 |
| 9,711,760 B2 * | 7/2017 | Soci | ........................ | H10K 59/00 |
| 9,741,865 B2 * | 8/2017 | Yamazaki | .............. | H01L 29/518 |
| 9,954,003 B2 * | 4/2018 | Matsuda | ........... | H01L 29/78648 |

(Continued)

*Primary Examiner* — Vu A Vu
(74) *Attorney, Agent, or Firm* — WPAT LAW; Anthony King

(57) ABSTRACT

A semiconductor device includes an oxide semiconductor stack, a first gate, a first contact structure, and a second contact structure. The oxide semiconductor stack includes an n-type oxide semiconductor layer and a p-type oxide semiconductor layer stacked on each other. The first gate is over the oxide semiconductor stack. The first contact structure and the second contact structure are at opposite sides of the first gate and electrically connected to the oxide semiconductor stack.

20 Claims, 48 Drawing Sheets

(56) References Cited

U.S. PATENT DOCUMENTS

| | | | | |
|---|---|---|---|---|
| 9,966,474 B2* | 5/2018 | Yamazaki | ......... | H01L 29/41733 |
| 10,008,611 B2* | 6/2018 | Matsumoto | ........... | H01L 21/383 |
| 10,164,120 B2* | 12/2018 | Kurata | .................... | H01L 21/28 |
| 10,290,657 B2* | 5/2019 | Hanyu | .............. | H01L 29/78675 |
| 10,680,066 B2* | 6/2020 | Heo | ...................... | H01L 29/778 |
| 10,714,633 B2* | 7/2020 | Yamazaki | ......... | H01L 29/78648 |
| 11,670,677 B2* | 6/2023 | Jun | ................. | H01L 21/823418 |
| | | | | 257/288 |
| 2004/0046201 A1* | 3/2004 | Noble | ................ | H10B 12/0383 |
| | | | | 257/E21.652 |
| 2013/0126881 A1* | 5/2013 | Erickson | ......... | H01L 21/823487 |
| | | | | 257/66 |
| 2020/0328210 A1* | 10/2020 | Wu | ................... | H01L 29/66545 |
| 2022/0238652 A1* | 7/2022 | Gardner | .......... | H01L 21/823885 |

* cited by examiner

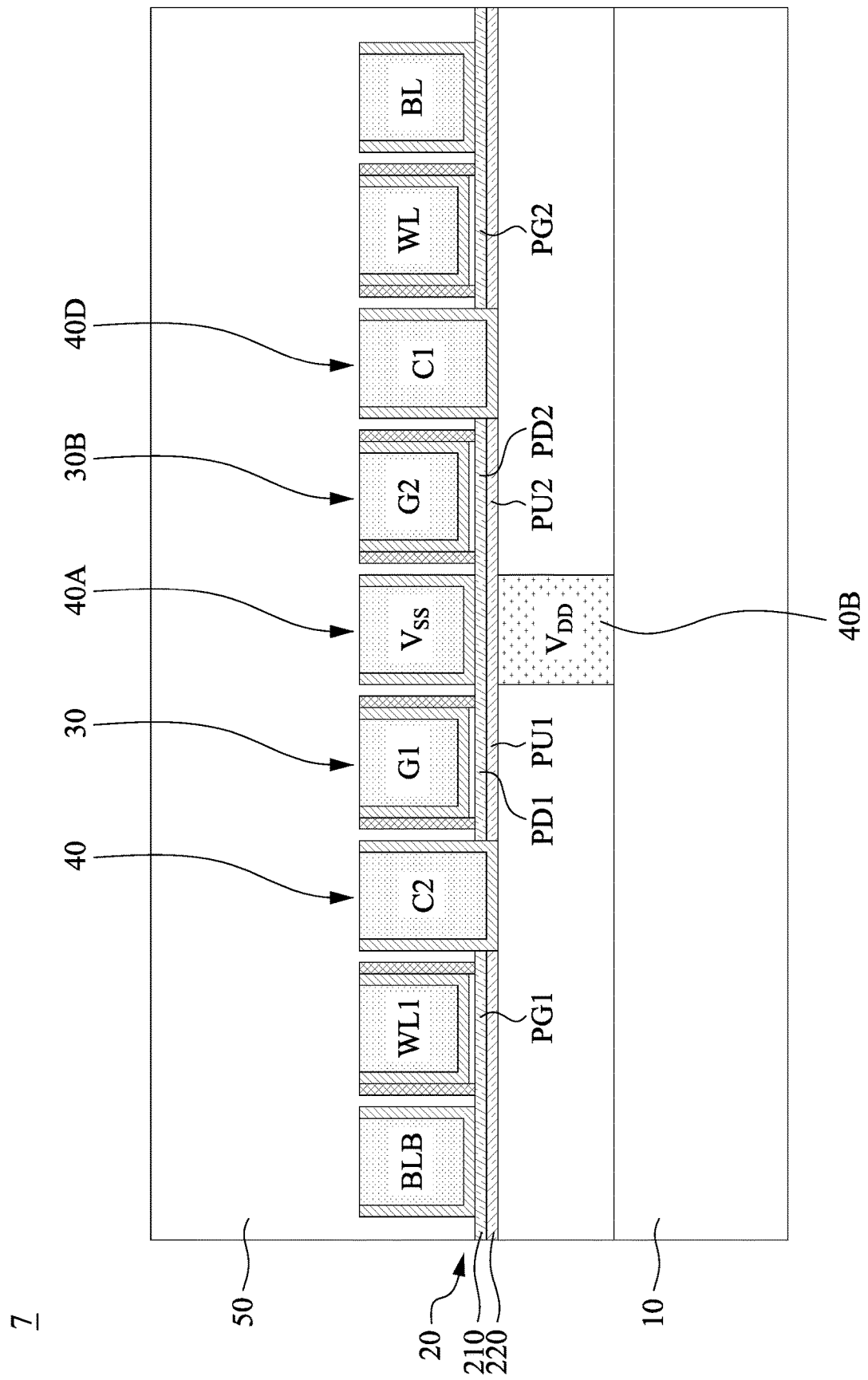

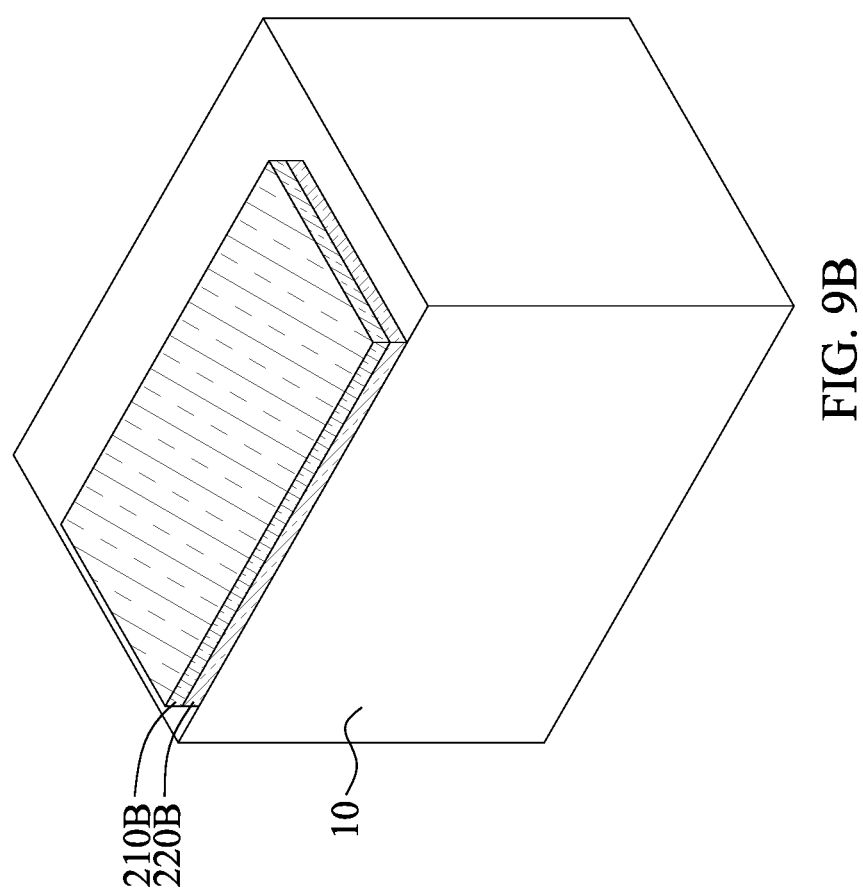

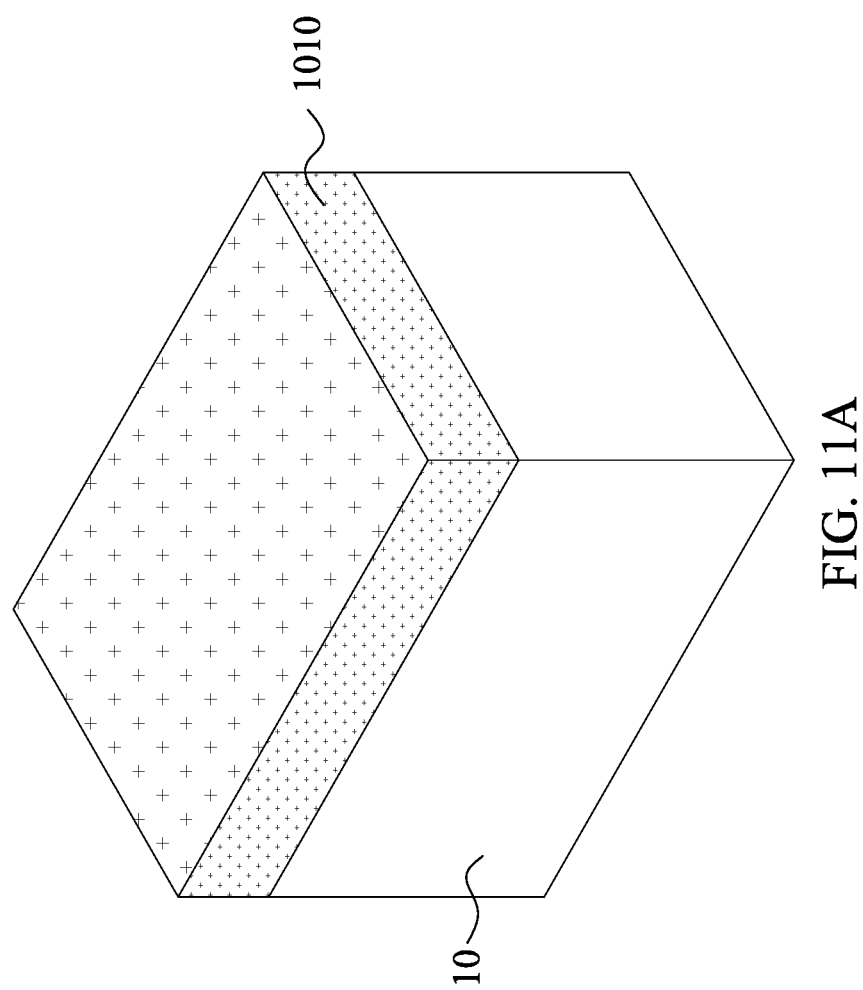

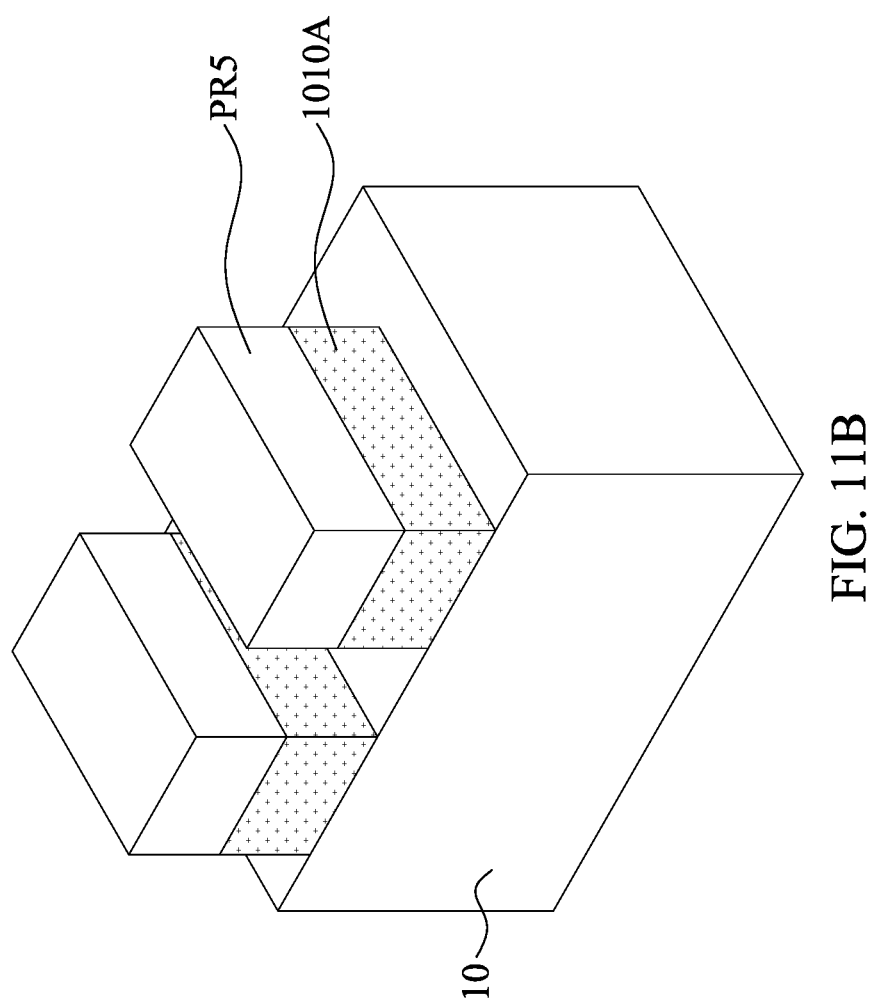

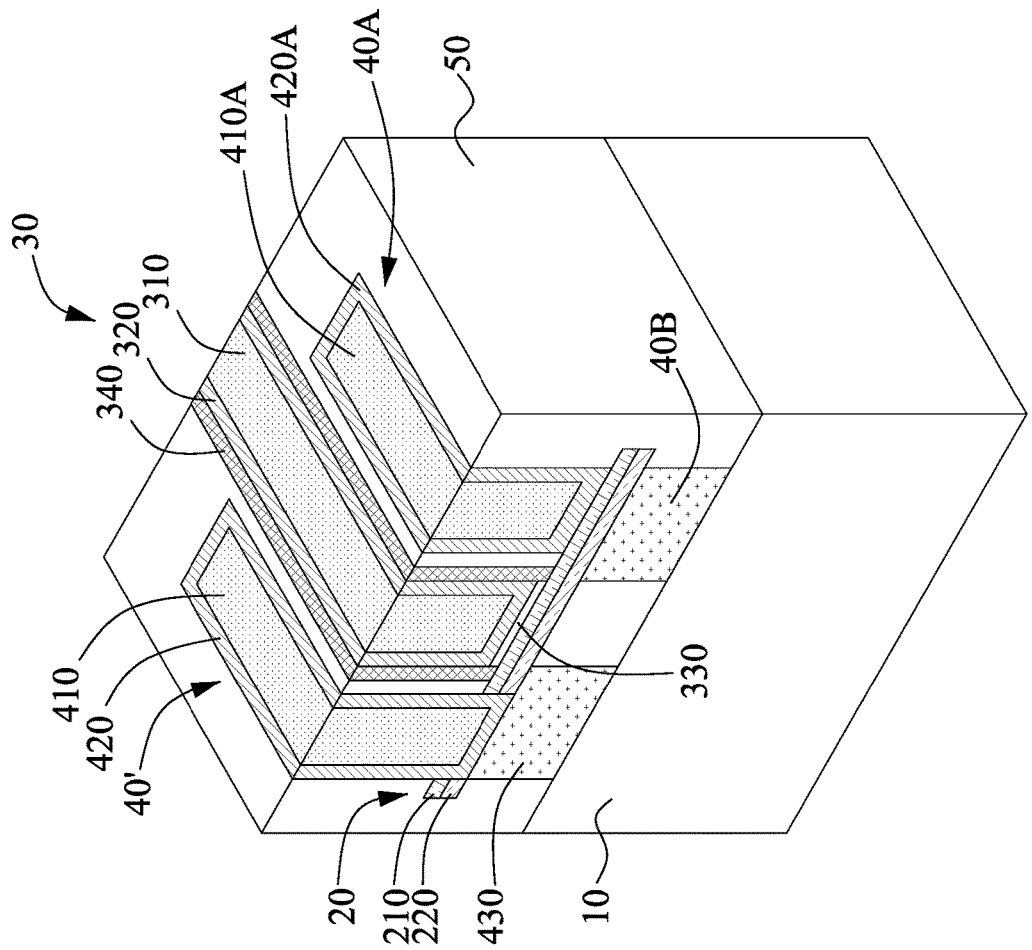

SEMICONDUCTOR DEVICE AND METHOD OF MANUFACTURING SEMICONDUCTOR DEVICE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 7B is a cross-sectional view of a semiconductor device in accordance with some embodiments of the present disclosure.

FIGS. 9A to 9H are cross-sectional views of intermediate stages of a method of manufacturing a semiconductor device in accordance with some embodiments of the present disclosure.

FIGS. 11A to 11M are cross-sectional views of intermediate stages of a method of manufacturing a semiconductor device in accordance with some embodiments of the present disclosure.

DETAILED DESCRIPTION

Figure 1A:
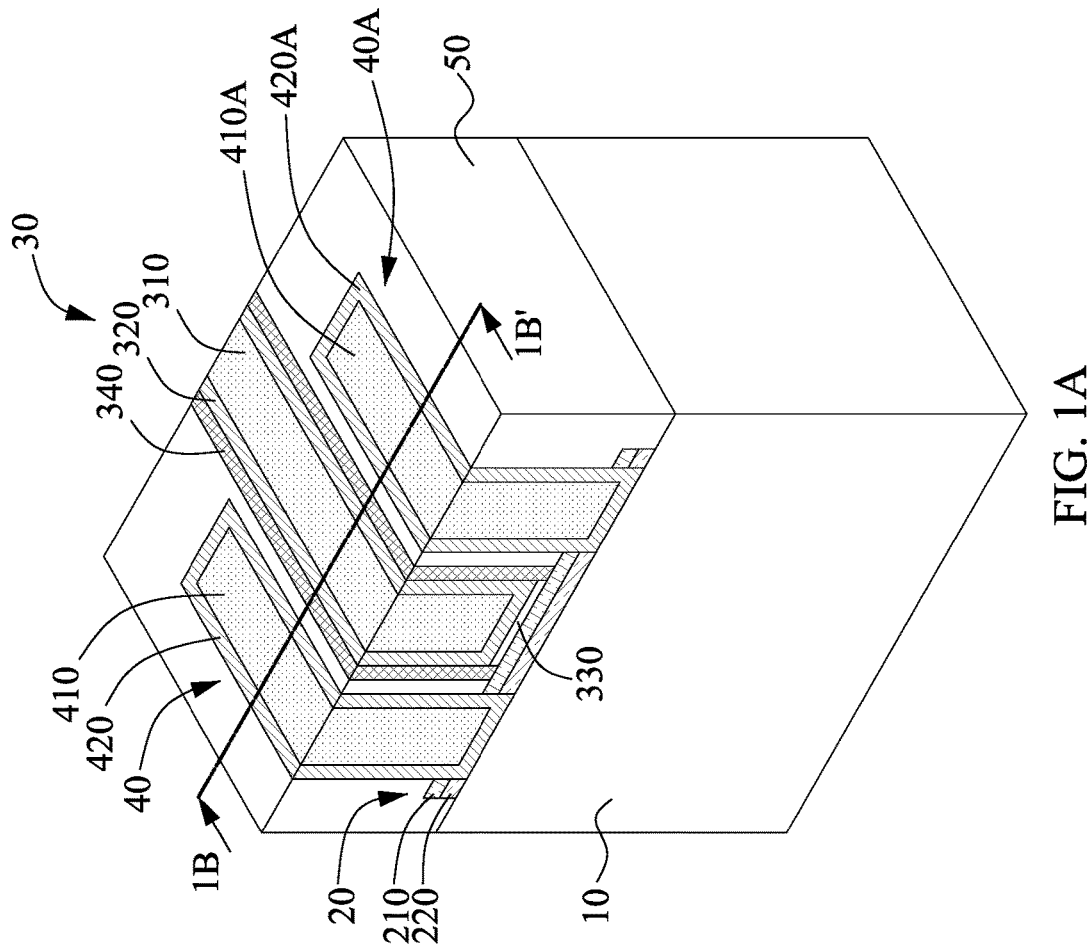
FIG. 1A is a top view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Embodiments of the present disclosure discuss semiconductor devices including a multilayer channel including both an n-type channel layer and a p-type channel corresponding to a gate structure and a set of contact structures. As such, the semiconductor device can serve as an ambipolar device which works as either an n-FET or a p-FET depending on the applied vias on the gate. In addition, the multilayer channel includes a combination of oxide material layers which may be formed by various deposition technique. Therefore, the selections of the materials of the multilayer channel are versatile, various possible arrangements or structures of the semiconductor device can be realized, and the cost and complexity of the manufacturing process can be reduced as well.

Figure 1B:
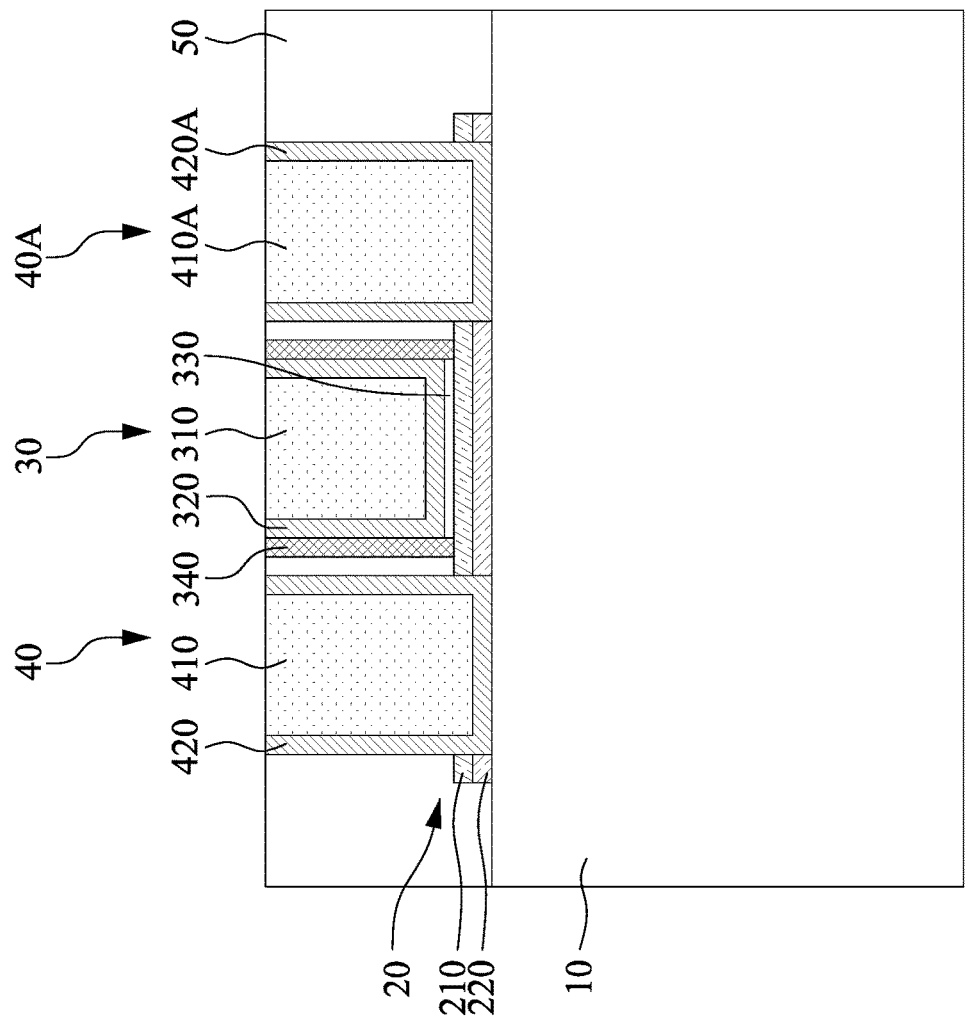
FIG. 1B is a cross-sectional view of a semiconductor device in accordance with some embodiments of the present disclosure.

FIG. 1A is a top view of a semiconductor device 1 in accordance with some embodiments of the present disclosure. FIG. 1B is a cross-sectional view of a semiconductor device 1 in accordance with some embodiments of the present disclosure. In some embodiments, FIG. 1B illustrates a cross-sectional view along the cross-sectional line 1B-1B' in FIG. 1A.

Referring to FIGS. 1A-B, in some embodiments, the semiconductor device 1 includes a substrate 10, a multilayer channel 20, a gate 30, contact structures 40 and 40A, and a passivation layer 50.

The substrate 10 may include a semiconductor substrate, a redistribution layer (RDL), a dielectric structure, or a combination thereof. The semiconductor substrate may include silicon, germanium, silicon germanium, or other proper semiconductor materials. The semiconductor substrate may be a bulk substrate or constructed as a semiconductor on an insulator (SOI) substrate. The RDL may include conductive layers and/or conductive vias formed in a dielectric structure.

The multilayer channel 20 may be formed or disposed over the substrate 10. In some embodiments, the multilayer channel 20 includes a plurality of channel layers of different materials. In some embodiments, the multilayer channel 20 includes an oxide semiconductor stack including oxide semiconductor layers 210 and 220 stacked on each other. In some embodiments, the multilayer channel 20 includes an n-type oxide semiconductor layer 210 (also referred to as "an n-type channel layer") and a p-type oxide semiconductor layer 220 (also referred to as "a p-type channel layer") stacked on each other. In some other embodiments, the oxide semiconductor layer 210 may be a p-type channel layer, and the oxide semiconductor layer 220 may be an n-type channel layer.

In some embodiments, the n-type oxide semiconductor layer 210 may be formed of or include indium gallium zinc oxide (IGZO), indium tin oxide (ITO), indium-aluminum-zinc oxide (IAZO), indium tungsten oxide (IWO), indium zinc oxide (IZO), any suitable oxide semiconductor materials, or any combination thereof. In some embodiments, the p-type oxide semiconductor layer 220 may be formed of or include tin oxide ($SnO_x$), nickel tin oxide ($NiSn_xO_y$), copper oxide (CuO), delafossite oxide, any suitable oxide semiconductor materials, or any combination thereof.

In some embodiments, the p-type oxide semiconductor layer 220 is electrically isolated from the n-type oxide semiconductor layer 210. In some embodiments, the p-type oxide semiconductor layer 220 directly contacts the n-type oxide semiconductor layer 210. In some embodiments, a thickness of the n-type oxide semiconductor layer 210 ranges from about 0.5 nm to about 20 nm, about 1 nm to about 1.0 nm, or about 5 nm. In some embodiments, a thickness of the p-type oxide semiconductor layer 220 ranges from about 0.5 nm to about 20 nm, about 1 nm to about 10 nm, or about 5 nm.

The gate 30 may be formed or disposed over the multilayer channel 20 (or the oxide semiconductor stack). In some embodiments, the gate 30 includes a conductive layer 310, a liner 320, a dielectric layer 330, and a spacer 340. In some embodiments, the liner 320 surrounds the conductive layer 310, and the dielectric layer 330 is between the conductive layer 310 and the multilayer channel 20. In some embodiments, the spacer 340 is at lateral sides of the conductive layer 310 and the liner 320. The conductive layer 310 may be or include metal, e.g., tungsten (W), molybdenum (Mo), ruthenium (Ru), any suitable metal or alloy thereof, or any combination thereof. The liner 320 may be or include TiN, TaN, Ti, any suitable materials, or any combination thereof. The dielectric layer 330 may be or include a high-k dielectric material, e.g., $HfO_2$, $Al_2O_3$, or the like. The spacer 340 may be or include a dielectric material, e.g., $Si_3N_4$ or the like.

The contact structure 40 and the contact structure 40A are at opposite sides of the gate 30 and electrically connected to the multilayer channel 20. In some embodiments, the contact structures 40 and 40A are source/drain (S/D) contacts and electrically connected to the n-type oxide semiconductor layer 210 and the p-type oxide semiconductor layer 220. In some embodiments, the contact structure 40 extends into the multilayer channel 20. In some embodiments, a portion of a lateral surface of the contact structure 40 directly contacts the n-type oxide semiconductor layer 210 and the p-type oxide semiconductor layer 220. In some embodiments, the contact structure 40A extends into the multilayer channel 20. In some embodiments, a portion of a lateral surface of the contact structure 40A directly contacts the n-type oxide semiconductor layer 210 and the p-type oxide semiconductor layer 220. In some other embodiments, at least one of the contact structures 40 and 40A may wrap around and contact the multilayer channel 20.

In some embodiments, the contact structure 40 includes a conductive layer 410 and a liner 420. In some embodiments, the liner 420 contacts the multilayer channel 20. In some embodiments, the contact structure 40A includes a conductive layer 410A and a liner 420A. In some embodiments, the liner 420A contacts the multilayer channel 20. The conductive layers 410 and 410A may be or include metal, e.g., tungsten (W), molybdenum (Mo), ruthenium (Ru), any suitable metal or alloy thereof, or any combination thereof. The liners 420 and 420A may be or include TiN, TaN, Ti, any suitable materials, or any combination thereof.

The passivation layer 50 may cover the multilayer channel 20, the gate 30, and the contact structures 40 and 40A. In some embodiments, the passivation layer 50 may be or include a dielectric material, e.g., silicon oxide.

According to some embodiments of the present disclosure, with the design of the multilayer channel 20 including both an n-type channel layer and a p-type channel corresponding to one gate structure (e.g., the gate 30) and one set of S/D contacts (e.g., the contacts structures 40 and 40A), the semiconductor device 1 can work as an n-FET and a p-FET in one device, which may be referred to as an ambipolar device. That is, the semiconductor device 1 can work as either an n-FET or a p-FET depending on the applied vias on the gate. For example, when a positive voltage is applied on the gate 30, an n-FET including the gate 30, the n-type channel layer (e.g., the n-type oxide material layer 210), and the contact structures 40 and 40A is in operation. For example, when a negative voltage is applied on the gate 30, a p-FET including the gate 30, the p-type channel layer (e.g., the p-type oxide material layer 220), and the contact structures 40 and 40A is in operation.

In addition, compared to the cases where S/D structures are doped regions which are formed by implantation, according to some embodiments of the present disclosure, the multilayer channel 20 includes a combination of oxide material layers which may be formed by various deposition technique. Therefore, the selections of the materials of the multilayer channel 20 are versatile, and the manufacture of deposited layers is relatively simplified, which allows various possible arrangements or structures of the semiconductor device 1 to be realized, for example, the semiconductor device 1 stacked vertically over another FET or elements. Moreover, the cost and complexity of the manufacturing process can be reduced as well.

Figure 2A:
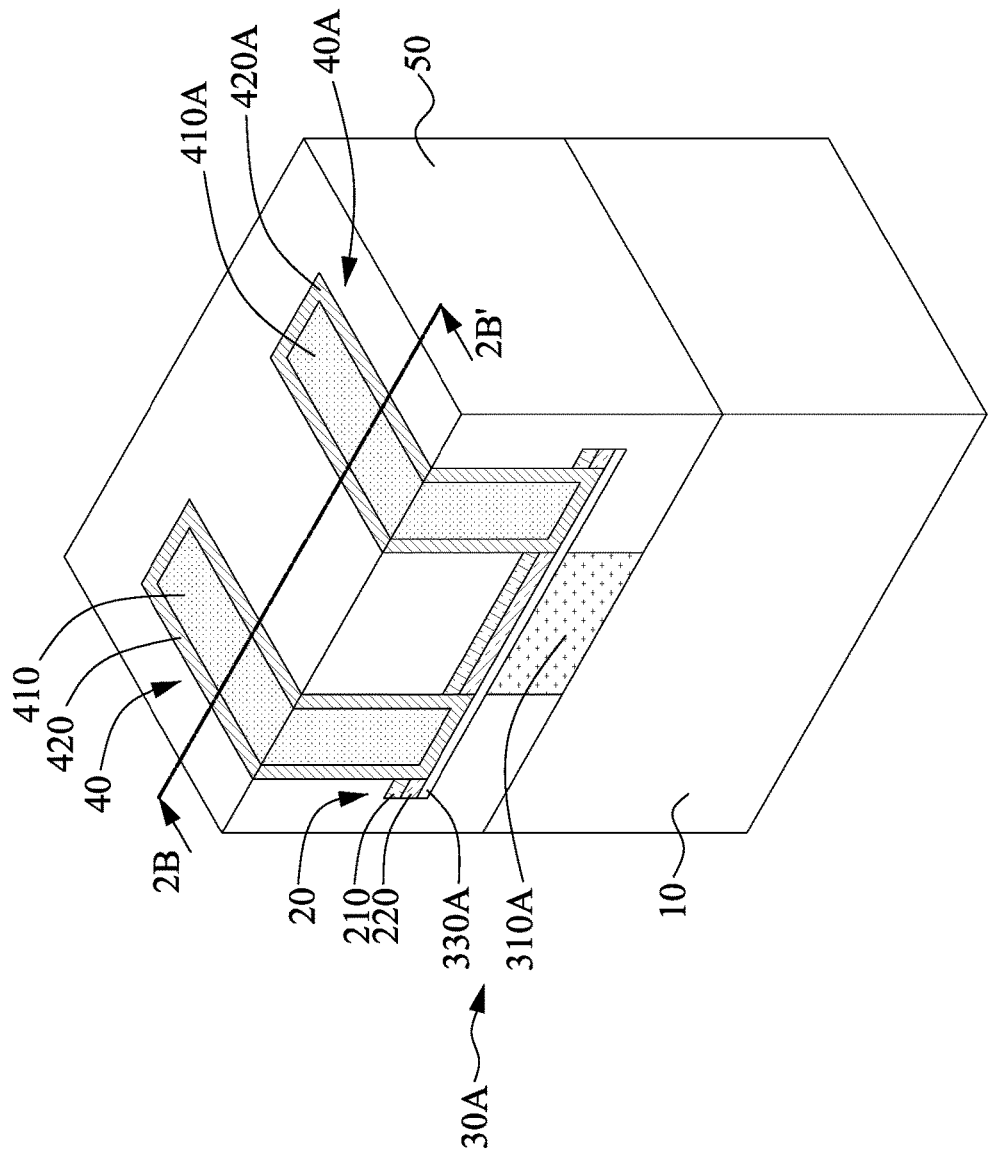
FIG. 2A is a top view of a semiconductor device in accordance with some embodiments of the present disclosure.
Figure 2B:
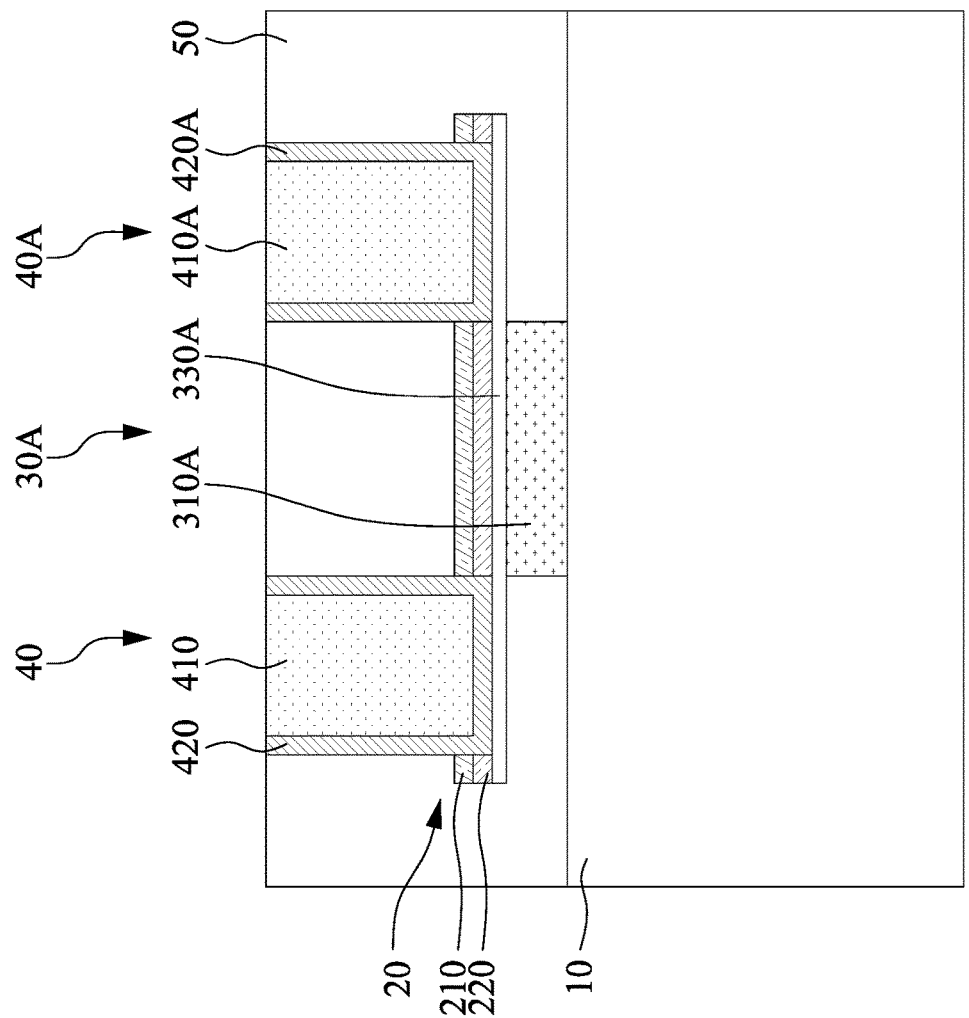
FIG. 2B is a cross-sectional view of a semiconductor device in accordance with some embodiments of the present disclosure.

FIG. 2A is a top view of a semiconductor device 2 in accordance with some embodiments of the present disclosure. FIG. 2B is a cross-sectional view of a semiconductor device 2 in accordance with some embodiments of the present disclosure. In some embodiments, FIG. 2B illustrates a cross-sectional view along the cross-sectional line 2B-2B' in FIG. 2A. In some embodiments, the semiconductor device 2 is similar to the semiconductor device 1 in FIGS. 1A and 1B, with differences therebetween as follows. Descriptions of similar components are omitted.

In some embodiments, the gate 30A and the contact structures 40 and 40A are on opposite sides (or surfaces) of the multilayer channel 20. In some embodiments, the gate 30A is between the multichannel 20 and the substrate 10. In some embodiments, the gate 30A includes a conductive layer 310A and a dielectric layer 330A. In some embodiments, the conductive layer 310A is between the substrate 10 and the dielectric layer 330A. The dielectric layer 330A may be or include a high-k dielectric material, e.g., $HfO_2$, $Al_2O_3$, or the like. In some embodiments, the dielectric layer 310A is formed on the multilayer channel 20. In some embodiments, a length of the dielectric layer 310A is substantially the same as a length of the multilayer channel 20 (e.g., a length of the n-type oxide material layer 210 and/or a length of the p-type oxide material layer 220).

Figure 3A:
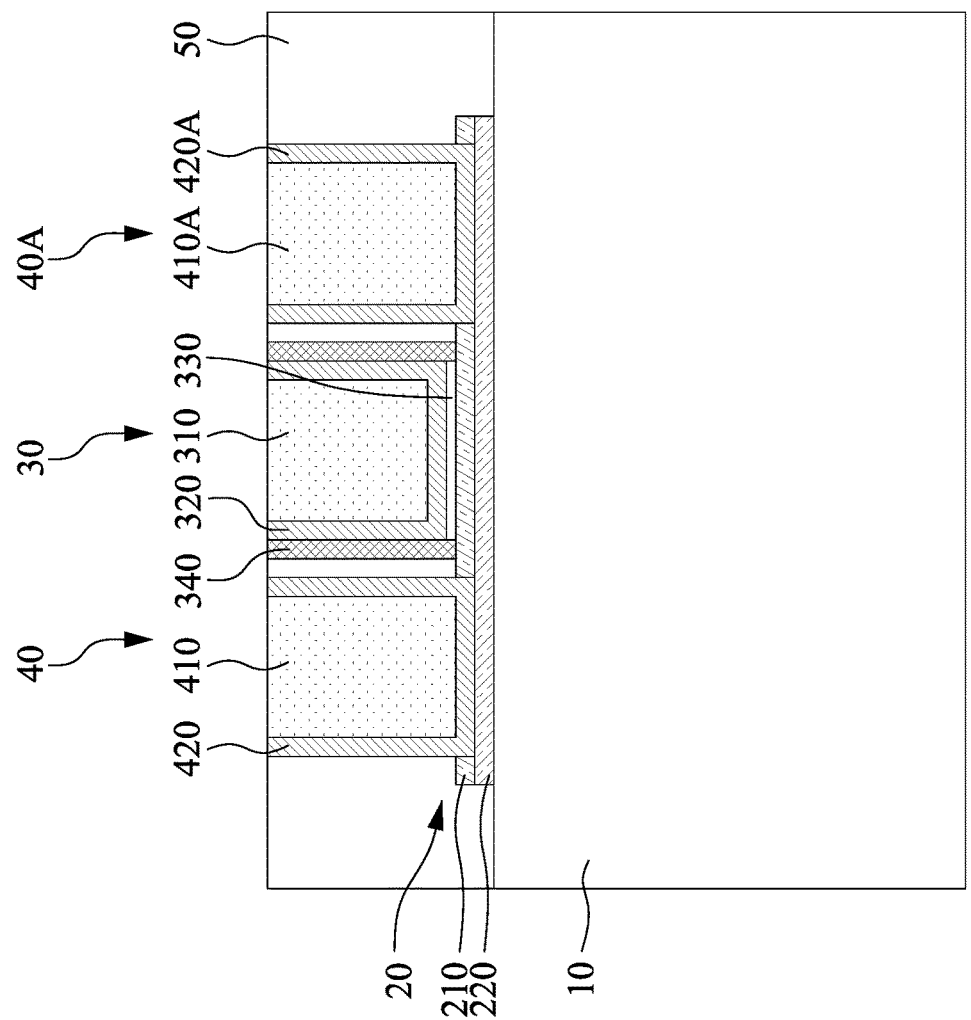
FIG. 3A is a cross-sectional view of a semiconductor device in accordance with some embodiments of the present disclosure.

FIG. 3A is a cross-sectional view of a semiconductor device 3A in accordance with some embodiments of the present disclosure. In some embodiments, the semiconductor device 3A is similar to the semiconductor device 1 in FIGS. 1A and 1B, with differences therebetween as follows. Descriptions of similar components are omitted.

In some embodiments, the contact structure 40 penetrates the n-type oxide semiconductor layer 210 and stops at an upper surface of the p-type oxide semiconductor layer 220. In some embodiments, a portion of a lateral surface of the contact structure 40 contacts the n-type oxide semiconductor layer 210, and a bottom surface of the contact structure 40 contacts the p-type oxide semiconductor layer 220. In some embodiments, the contact structure 40 electrically connects to the n-type oxide semiconductor layer 210 and the p-type oxide semiconductor layer 220. In some embodiments, the contact structure 40A penetrates the n-type oxide semiconductor layer 210 and stops at an upper surface of the p-type oxide semiconductor layer 220. In some embodiments, a portion of a lateral surface of the contact structure 40A contacts the n-type oxide semiconductor layer 210, and a bottom surface of the contact structure 40A contacts the p-type oxide semiconductor layer 220. In some embodiments, the contact structure 40A electrically connects to the n-type oxide semiconductor layer 210 and the p-type oxide semiconductor aver 220.

Figure 3B:
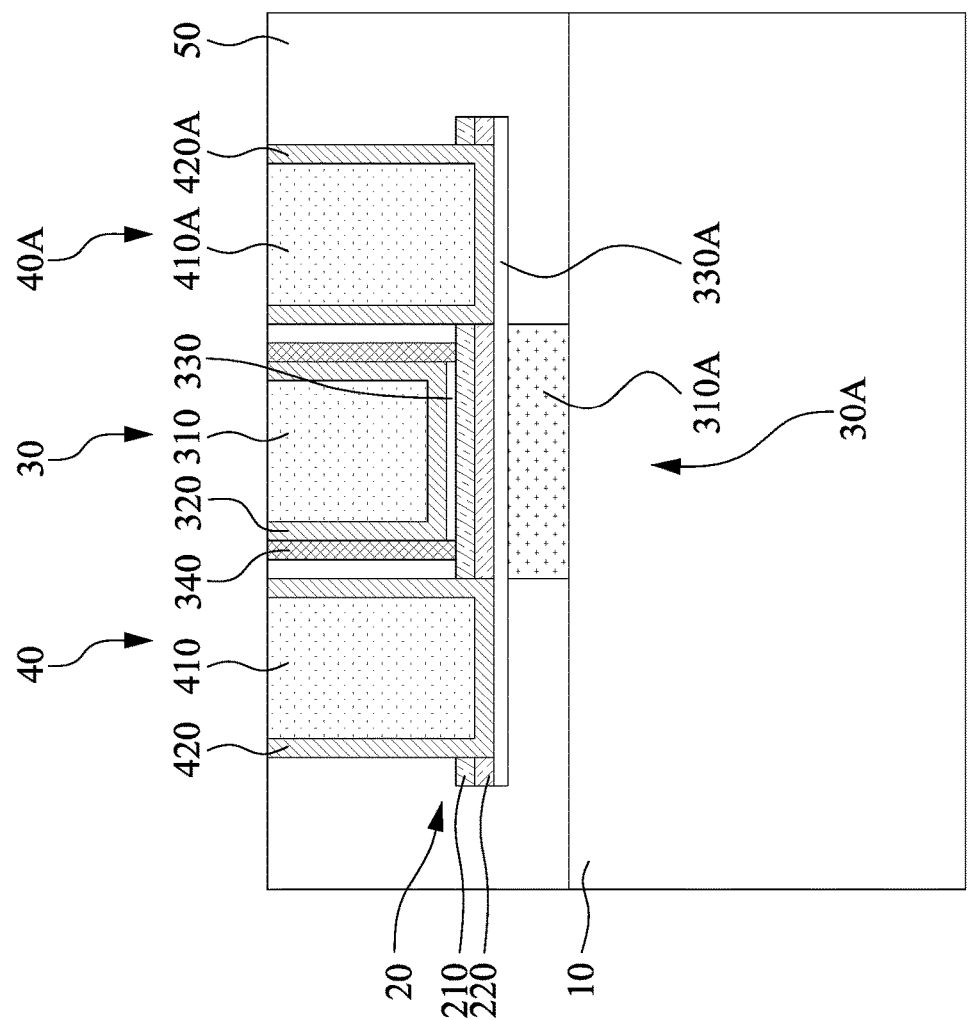
FIG. 3B is a cross-sectional view of a semiconductor device in accordance with some embodiments of the present disclosure.

FIG. 3B is a cross-sectional view of a semiconductor device 3B in accordance with some embodiments of the present disclosure. In some embodiments, the semiconductor device 313 is similar to the semiconductor device 1 in FIGS. 1A and 1B, with differences therebetween as follows. Descriptions of similar components are omitted.

In some embodiments, the semiconductor devices 3B includes gates 30 and 30A over opposite surfaces of the multilayer channel 20. In some embodiments, the gate 30 is electrically connected to the gate 30A. In some embodiments, the gates 30 and 30A are applied with the same voltage. According to some embodiments of the present disclosure, with the design of the gates 30 and 30A, the control of the gate over the semiconductor device 3B can be enhanced.

Figure 4A:
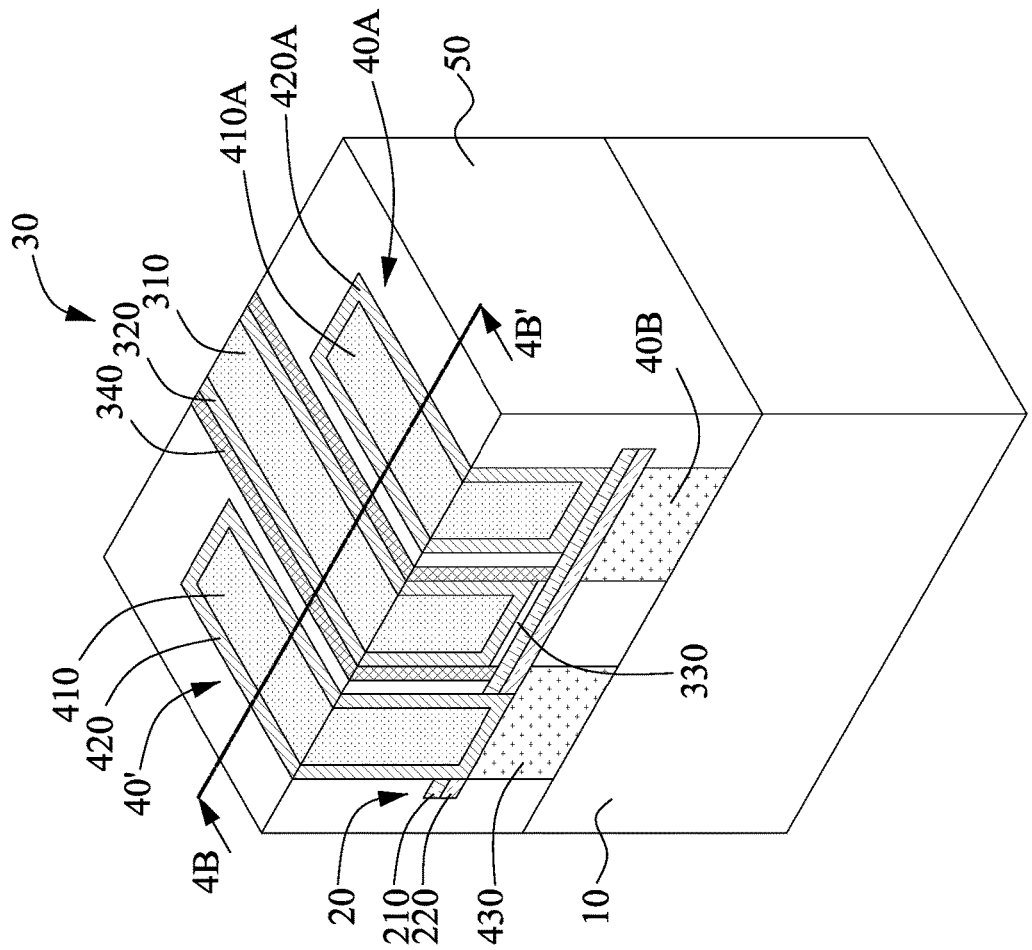
FIG. 4A is a top view of a semiconductor device in accordance with some embodiments of the present disclosure.
Figure 4B:
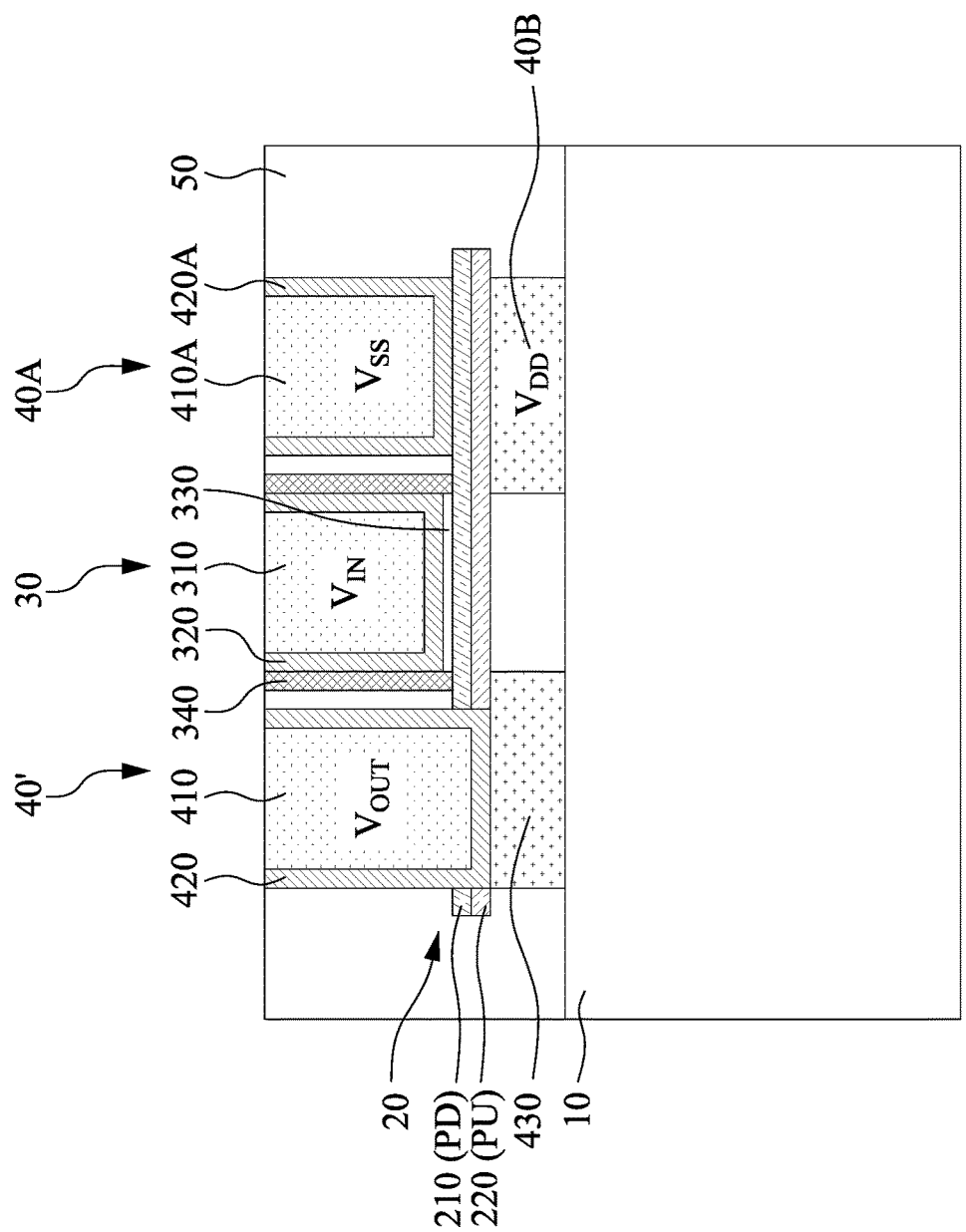
FIG. 4B is a cross-sectional view of a semiconductor device in accordance with some embodiments of the present disclosure.

FIG. 4A is a top view of a semiconductor device 4 in accordance with some embodiments of the present disclosure. FIG. 4B is a cross-sectional view of a semiconductor device 2 in accordance with some embodiments of the present disclosure. In some embodiments, FIG. 4B illustrates a cross-sectional view along the cross-sectional line 4B-4B' in FIG. 4A. In some embodiments, the semiconductor device 4 is similar to the semiconductor device 1. In FIGS. 1A and 1B, with differences therebetween as follows. Descriptions of similar components are omitted.

In some embodiments, the semiconductor device 4 includes a gate 30, contact structures 40', 40A, and 40B, and a passivation layer 50. In some embodiments, the contact structure 40' includes conductive layers 410 and 430 and a liner 420. In some embodiments, the liner 420 surrounds the conductive layer 410, and the conductive layer 430 electrically connects to the liner 420 and the conductive layer 410. In some embodiments, the contact structure 40' penetrates the multilayer channel 20. In some embodiments, the contact structures 40A and 40B are on opposite sides or surfaces of the multilayer channel 20.

In some embodiments, the contact structure 40' electrically connects to the n-type oxide semiconductor layer 210 and the p-type oxide semiconductor layer 220. In some embodiments, the contact structure 40A electrically connects to the n-type oxide semiconductor layer 210. In some embodiments, the contact structure 4013 electrically connects to the p-type oxide semiconductor layer 220. In some embodiments, the n-type oxide semiconductor layer 210 is electrically isolated from the p-type oxide semiconductor layer 220. In some embodiments, the semiconductor device 4 includes an inverter.

Figure 4C:
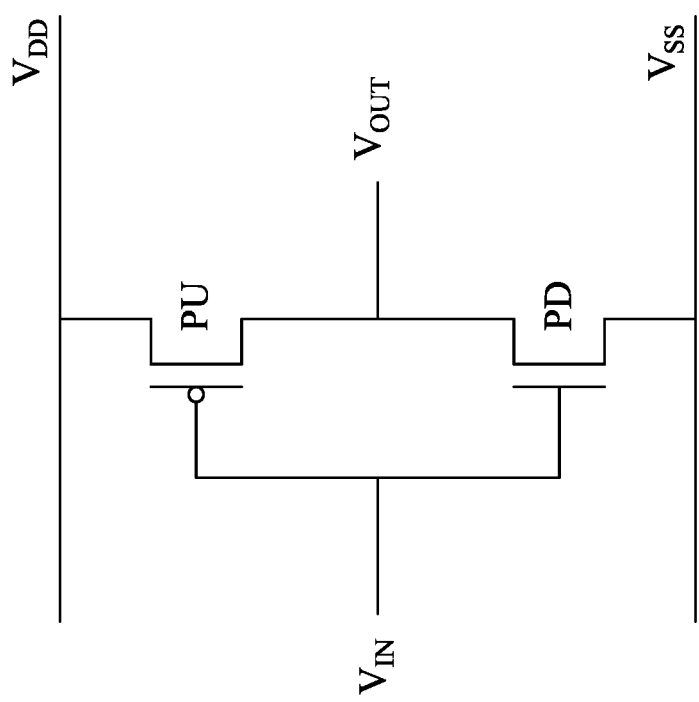
FIG. 4C illustrates a schematic view of a circuit in accordance with some embodiments of the present disclosure.

FIG. 4C illustrates a schematic view of a circuit in accordance with some embodiments of the present disclosure. In some embodiments, the circuit illustrated in FIG. 4C may be implemented with the semiconductor device 4 illustrated in FIGS. 4A-4B. In some embodiments, the circuit illustrated in FIG. 4C is an inverter.

Referring to FIGS. 4A-4C, in some embodiments, the circuit includes a p-FET (or a pull-up transistor (PU)) and an n-FET (or a pull-down transistor (PD)). In some embodiments, the p-FET includes the gate 30 connected to a voltage input ($V_{IN}$), the p-type oxide semiconductor layer 220 serving as the channel layer, the contact structure 40' connected to a voltage output ($V_{OUT}$) serving as drain, and the contact structure 40B connected to a first voltage ($V_{DD}$) serving as source. In some embodiments, the n-PET includes the gate 30 connected to the voltage input ($V_{IN}$), the n-type oxide semiconductor layer 210 serving as the channel layer, the contact structure 40' connected to the voltage output ($V_{OUT}$) serving as drain, and the contact structure 40A connected to a second voltage ($V_{SS}$) serving as source.

In some embodiments, the drains of the n-FET and the p-FET are shorted by the contact structure 40'. In some embodiments, only one FET is turned-on at a time; that is, it is only either the n-FET or the p-FET that is turned-on depending on the applied vias on the gate 30. In some embodiments, the first voltage ($V_{DD}$) may be a supply voltage (e.g., a positive voltage), and the second voltage ($V_{SS}$) may be a low voltage side or ground. In some embodiments, the n-FET and the p-FET collectively function as an inverter.

According to some embodiments of the present disclosure, with the design of the multilayer channel 20, the inverter (e.g., the semiconductor device 4) may include only one gate structure (e.g., the gate 30) serving to connect to the voltage input ($V_{IN}$) for both of the p-FET and the n-FET without routing additional conductive lines to connect the separate gate structures of the p-FET and the n-FET to the voltage input ($V_{IN}$). In addition, the p-FET structure and the n-FET structure can be stacked vertically, instead of arranged side-by-side, thereby a relatively complex 3D arrangements of various transistors within a device structure can be realized. Therefore, the flexibility of the design of device structures including various transistors can be increased.

Figure 5:
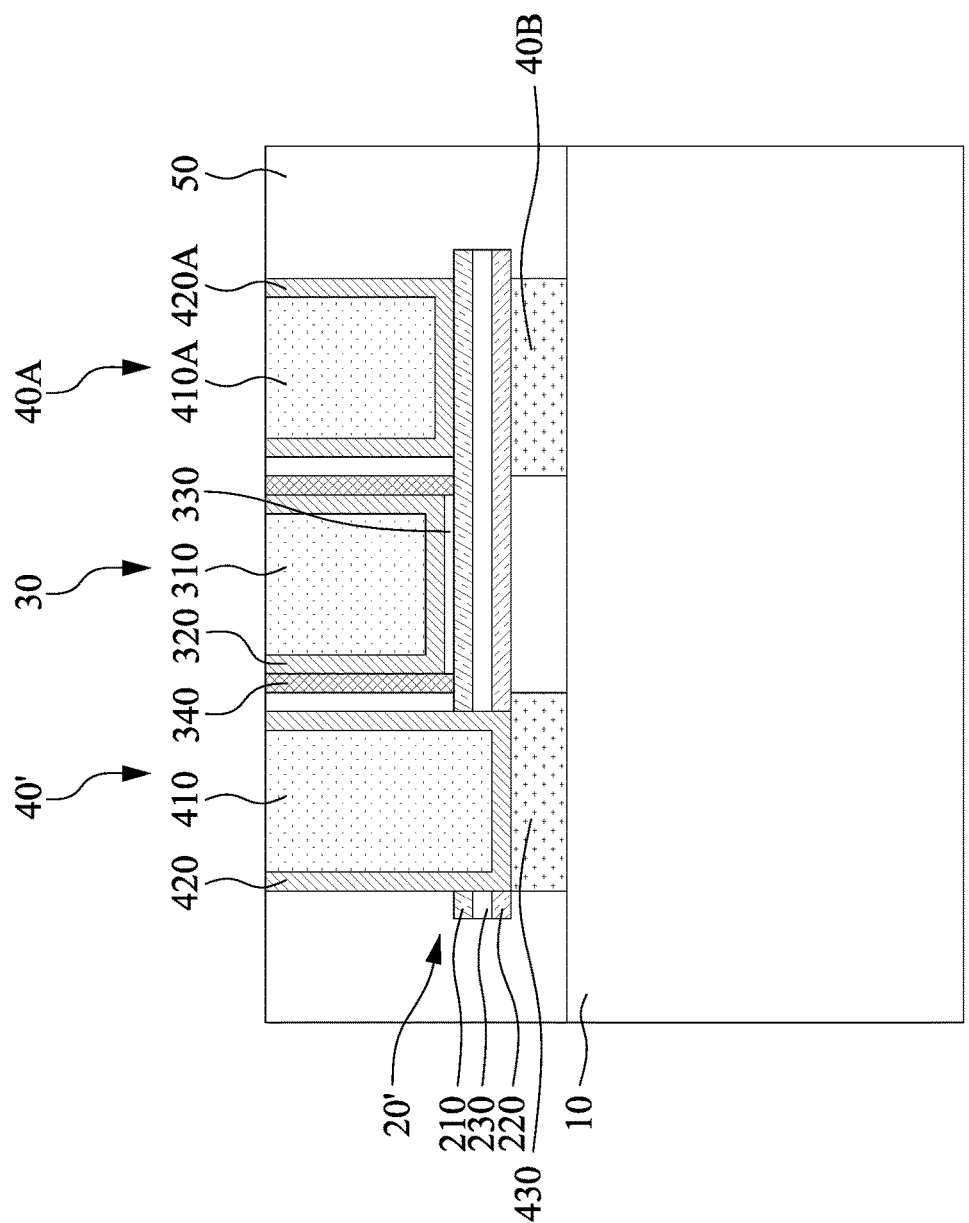
FIG. 5 is a cross-sectional view of a semiconductor device in accordance with some embodiments of the present disclosure.

FIG. 5 is a cross-sectional view of a semiconductor device 5 in accordance with some embodiments of the present disclosure. In some embodiments, the semiconductor device 5 is similar to the semiconductor device 4 in FIGS. 4A and 4B, with differences therebetween as follows. Descriptions of similar components are omitted.

In some embodiments, the multilayer channel 20' further includes an insulating barrier 230 stacked between and in contact with the n-type oxide semiconductor layer 210 and the p-type oxide semiconductor layer 220. In some embodiments, the insulating barrier 230 separates the n-type oxide semiconductor layer 210 from the p-type oxide semiconductor layer 220. In some embodiments, the n-type oxide semiconductor layer 210 is physically spaced apart from the p-type oxide semiconductor layer 220 by the insulating barrier 230. In some embodiments, a thickness of the insulating barrier 230 ranges from about 0.5 nm to about 20 nm, about 1 m to about 10 nm, or about 5 nm. In some embodiments, the contact structure 40' penetrates the insulating barrier 230.

According to some embodiments of the present disclosure, the insulating barrier 230 can improve the electrical isolation between the n-type oxide semiconductor layer 210 and the p-type oxide semiconductor layer 220. Therefore, reduction of leakage (e.g., leakage from the $V_{DD}$ contact structure to the $V_{SS}$ contact structure) can be improved.

Figure 6:
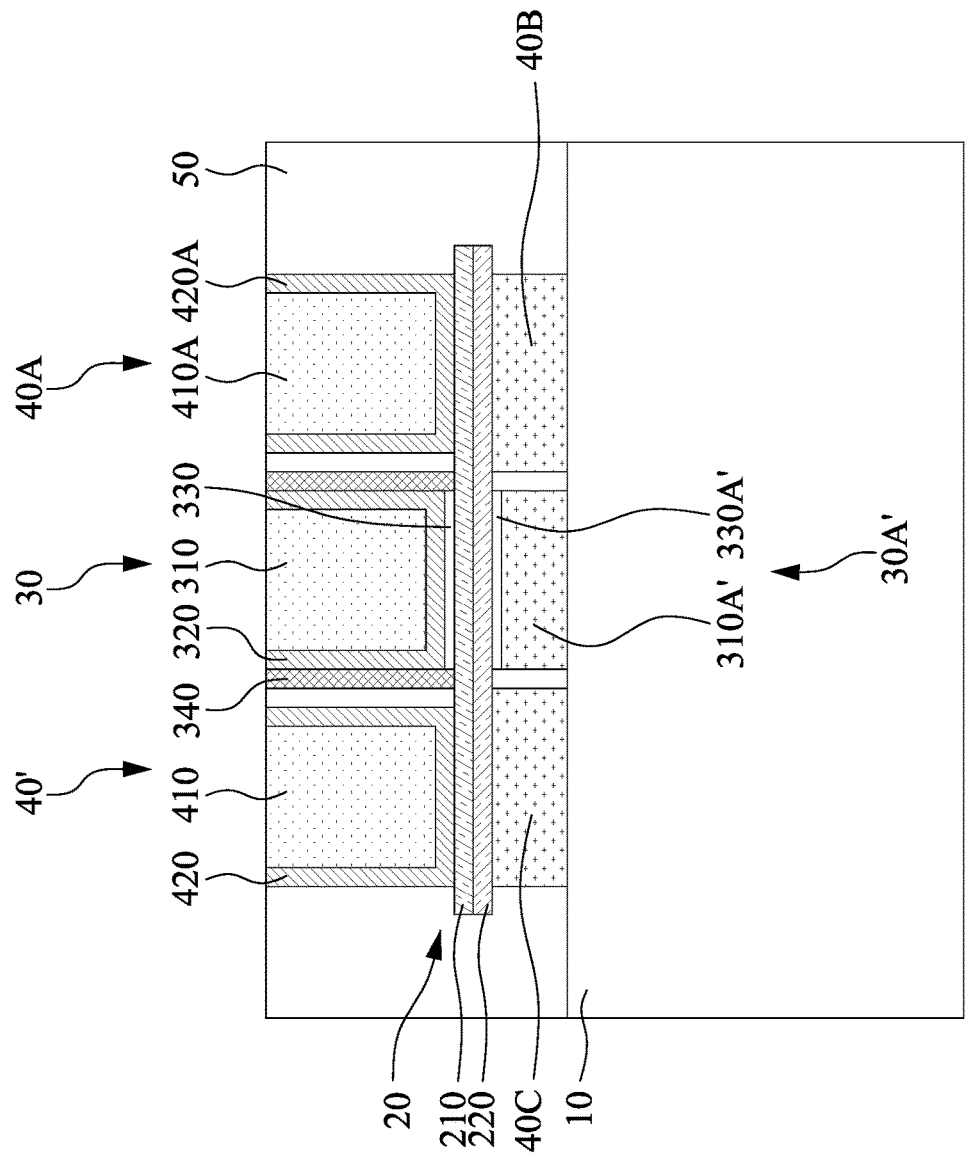
FIG. 6 is a cross-sectional view of a semiconductor device in accordance with some embodiments of the present disclosure.

FIG. 6 is a cross-sectional view of a semiconductor device 6 in accordance with some embodiments of the present disclosure. In some embodiments, the semiconductor device 6 is similar to the semiconductor device 1 in FIGS. 1A and 1B, with differences therebetween as follows. Descriptions of similar components are omitted.

In some embodiments, the semiconductor device 6 includes gates 30 and 30A' and contact structures 40, 40A, 40B, and 40C, In some embodiments, the gate 30 and the gate 30A are over opposite surfaces of the multilayer channel 20. In some embodiments, the gate 30A' includes a conductive layer 310A" and a dielectric layer 330A'.

In some embodiments, the contact structure 40 and the contact structure 40A are at opposite sides of the gate 30 and electrically connected to the multi layer channel 20. In some embodiments, the contact structure 40B and the contact structure 40C are at opposite sides of the gate 30A' and electrically connected to the multilayer channel 20. In some embodiments, the n-type oxide semiconductor layer 210 is electrically isolated from the p-type oxide semiconductor layer 220. In some embodiments, the contact structure 40 and the contact structure 40A electrically connect to the n-type oxide semiconductor layer 210, and the contact structure 40B and the contact structure 40C electrically connect to the p-type oxide semiconductor layer 220.

In some embodiments, the semiconductor device 6 includes an n-FET including the gate 30, the n-type oxide semiconductor layer 210, and the contact structures 40 and 40A; and a p-FET including the gate 30A', the p-type oxide semiconductor layer 220, and the contact structures 40B and 40C. In some embodiments, the gate 30 and the gate 30A' are supplied with the same input voltage, and the n-FET and the p-FET may be stacked vertically and collectively function as an ambipolar device. In some other embodiments, the gate 30 and the gate 30A' are supplied with different input voltages, and the n-FET and the p-FET may function separately or independently as two ambipolar devices.

Figure 7A:
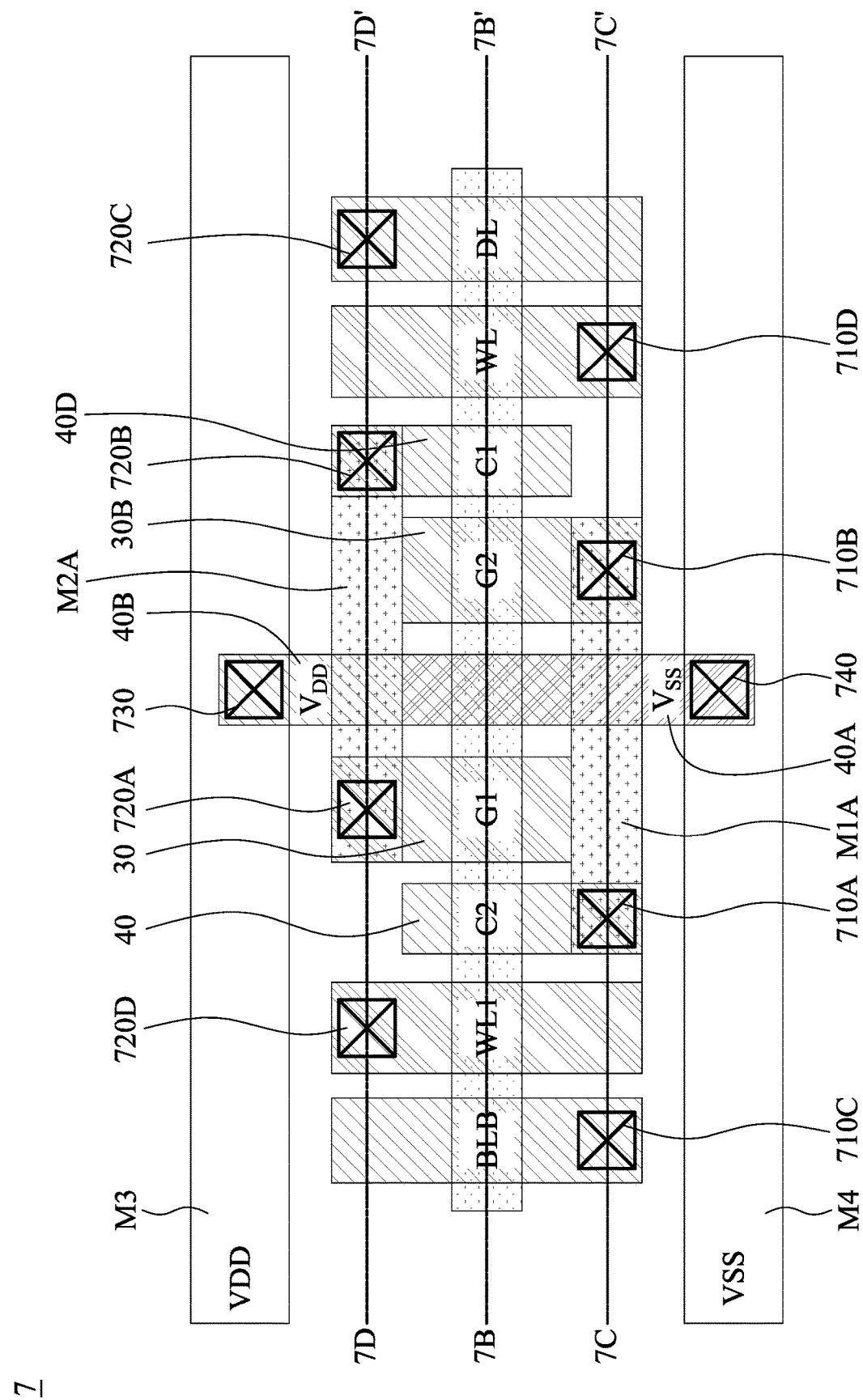
FIG. 7A is a top view of a semiconductor device in accordance with some embodiments of the present disclosure.
Figure 7C:
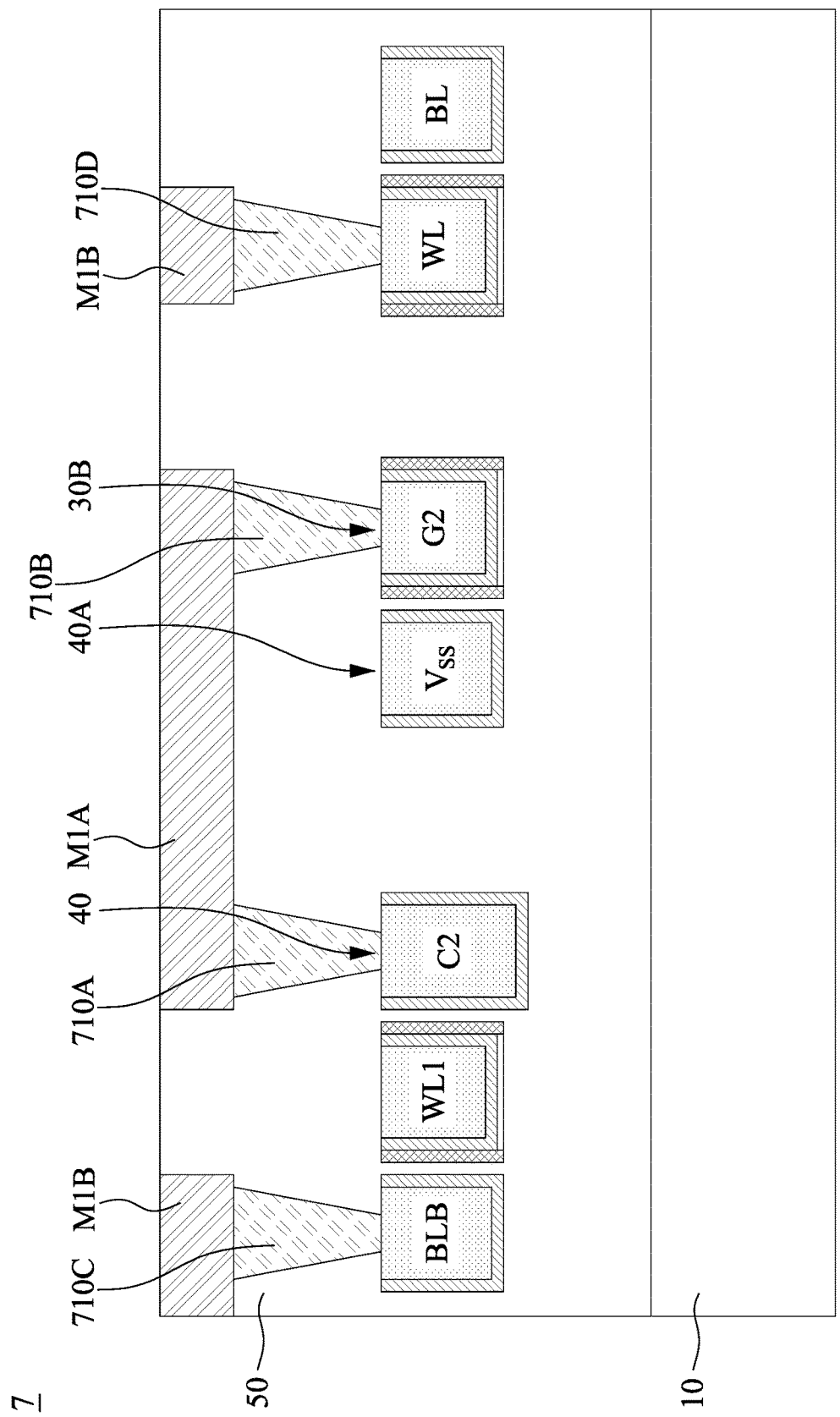
FIG. 7C is a cross-sectional view of a semiconductor device in accordance with some embodiments of the present disclosure.
Figure 7D:
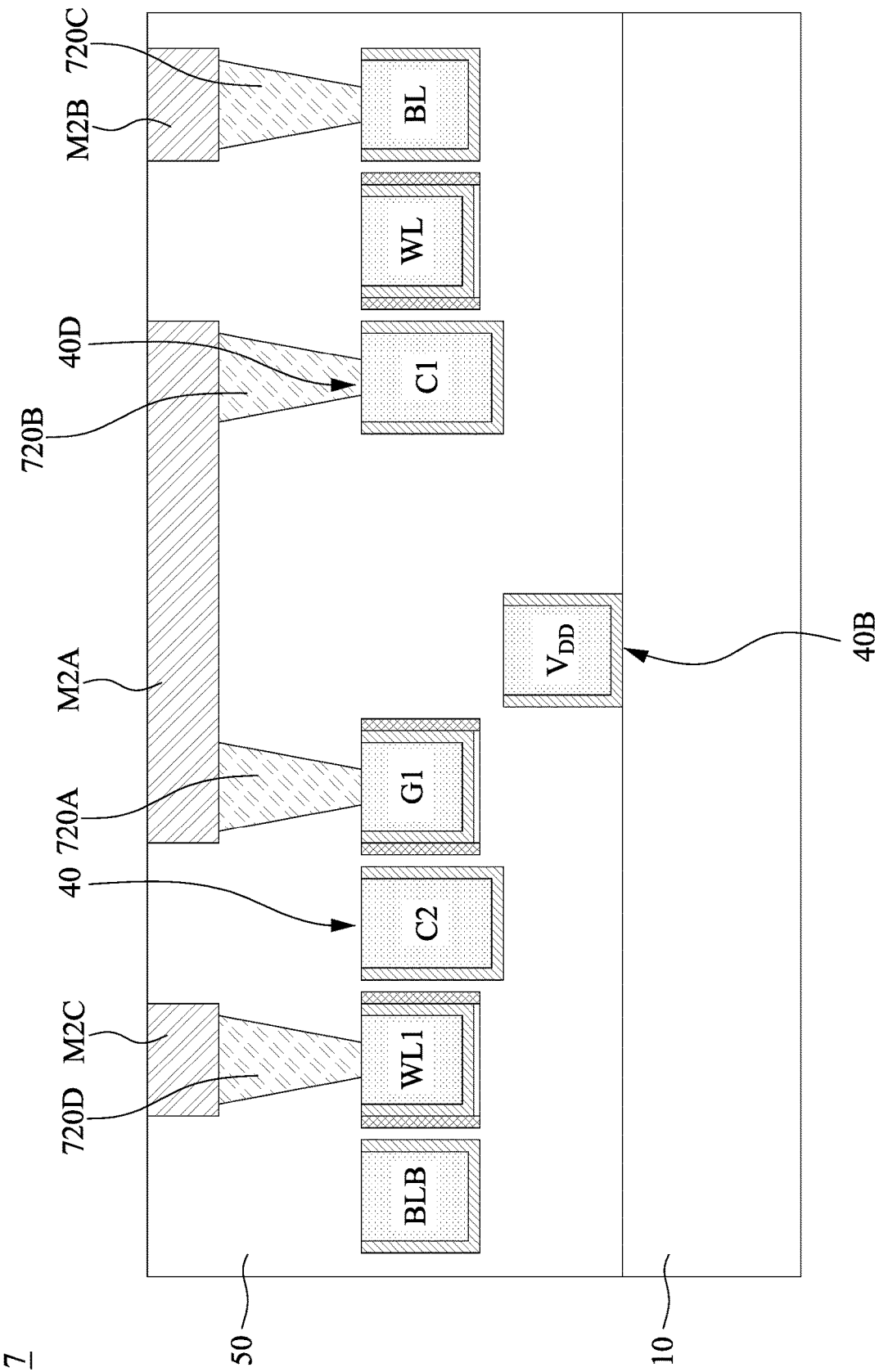
FIG. 7D is a cross-sectional view of a semiconductor device in accordance with some embodiments of the present disclosure.

FIG. 7A is a top view of a semiconductor device 7 in accordance with some embodiments of the present disclosure. FIG. 7B is a cross-sectional view of a semiconductor device 7 in accordance with some embodiments of the present disclosure. FIG. 7C is a cross-sectional view of a semiconductor device 7 in accordance with some embodiments of the present disclosure. FIG. 7D is a cross-sectional view of a semiconductor device 7 in accordance with some embodiments of the present disclosure. In some embodiments, FIG. 7B illustrates a cross-sectional view along the cross-sectional line 7B-7B' in FIG. 7A, FIG. 7C illustrates a cross-sectional view along the cross-sectional line 7C-7C' in FIG. 7A, FIG. 7D illustrates a cross-sectional view along the cross-sectional line 7D-7D' in FIG. 7A. In some embodiments, the semiconductor device 7 is similar to the semiconductor device 4 in FIGS. 4A and 4B, with differences therebetween as follows. Descriptions of similar components are omitted.

In some embodiments, the semiconductor device 7 includes a multilayer channel 20, gates 30 and 30B, contact structures 40, 40A, 40B, and 40D, word lines WL and WL1, bit line contacts BL and BLB, conductive vias 710A-710D, 720A-720D, 730, and 740, and metal layers M1A, M1B, M1C, M2A, M2B, M2C, M3, and M4.

Referring to FIGS. 7A-7D, in some embodiments, the n-type oxide semiconductor layer 210 is electrically isolated from the p-type oxide semiconductor layer 220. In some embodiments, the semiconductor device 7 includes an SRAM.

Referring to FIGS. 7A-7D, in some embodiments, the gate 30 (or gate G1) electrically connects to the contact structure 40D (or contact or node C1), and the gate 30B (or gate G2) electrically connects to the contact structure 40 (or contact or node C2). In some embodiments, the contact structure 40B electrically connects to the metal layer M3 through the conductive via 730, and the metal layer M3 electrically connects to a first voltage ($V_{DD}$), which may be a supply voltage (e.g., a positive voltage). In some embodiments, the contact structure 40A electrically connects to the metal layer M4 through the conductive via 740, and the metal layer M4 electrically connects to a second voltage ($V_{SS}$), which may be a low voltage side or ground. In some embodiments, the semiconductor device 7 includes back-end-of-line (BEOL) transistors, and the substrate 10 may include an interconnection structure or metal layers which may provide electrical connection to the transistors of the semiconductor device 7.

Referring to FIGS. 7A and 7B, in some embodiments, the gate 30 (or the gate G1) and the gate 30B (or the gate G2) are over the multilayer channel 20. In some embodiments, the word lines WL and WL1 and the bit line contacts BL and BLB are over the multilayer channel 20. In some embodiments, the passivation layer 50 covers the multilayer channel 20, the gates 30 and 30B, the contact structures 40, 40A, 40B, and 40D, the word lines WL and WL1, and the bit line contacts BL and BLB. In some embodiments, the contact structure 40 electrically connects to the n-type oxide semiconductor layer 210 and the p-type oxide semiconductor layer 220. In some embodiments, the contact structure 40 penetrates the multilayer channel 20. In some embodiments, the contact structure 40A electrically connects to the n-type oxide semiconductor layer 210, and the contact structure 40B electrically connects to the p-type oxide semiconductor layer 220. In some embodiments, the contact structure 40D electrically connects to the n-type oxide semiconductor layer 210 and the p-type oxide semiconductor layer 220. In some embodiments, the contact structure 40D penetrates the multilayer channel 20.

Referring to FIGS. 7A and 7C, in some embodiments, the gate 30B (or the gate G2) electrically connects to the contact structure 40 (or the contact or node C2) through the conductive vias 710A and 710B and the metal layer M1A. In some embodiments, the bit lint contact BLB electrically connects to the metal layer M1B through the conductive via 710C. In some embodiments, the word line WL electrically connects to the metal layer M1C through the conductive via 710D. In some embodiments, the passivation layer 50 covers the metal layers M1A, M1B, and M1C and the conductive vias 710A-710D.

Referring to FIGS. 7A and 7D, in some embodiments, the gate 30 (or the gate G1) electrically connects to the contact structure 40D (or the contact or node C1) through the conductive vias 720A and 720B and the metal layer M2A. In some embodiments, the bit line contact BL electrically connects to the metal layer M2B through the conductive via 7200. In some embodiments, the word line WL1 electrically connects to the metal layer M2C through the conductive via 720D. In some embodiments, the passivation layer 50 covers the metal layers M2A, M2B, and M2C and the conductive vias 720A-720D.

Figure 7E:
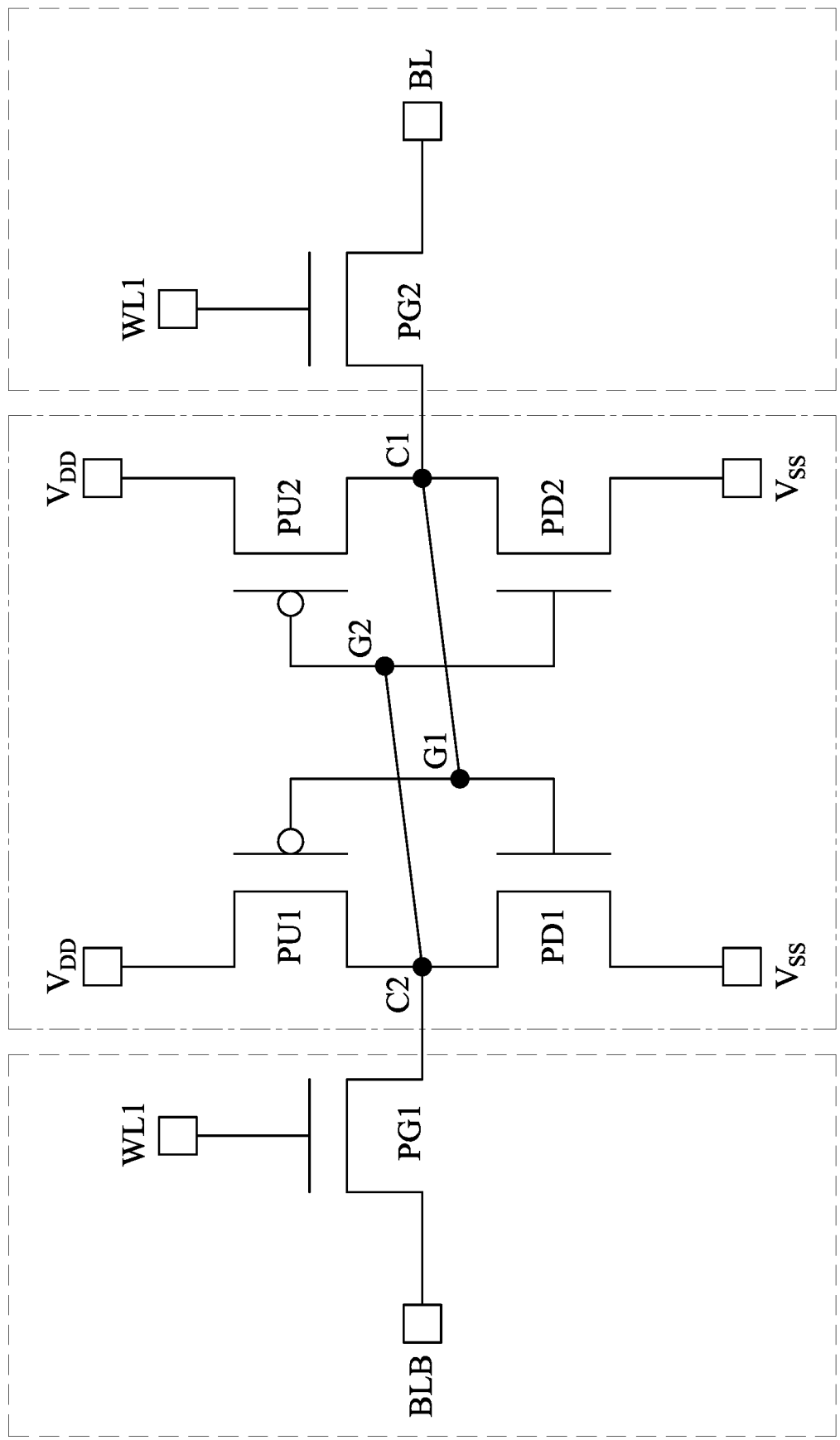
FIG. 7E illustrates a schematic view of a circuit in accordance with some embodiments of the present disclosure.

FIG. 7E illustrates a schematic view of a circuit in accordance with some embodiments of the present disclosure. In some embodiments, the circuit illustrated in FIG. 7E may be implemented with the semiconductor device 7 illustrated in FIGS. 7A-7D. In some embodiments, the circuit illustrated in FIG. 7E is an SRAM.

Referring to FIGS. 7A-7E, in some embodiments, the circuit includes two cross-coupled inverters. In some embodiments, the circuit includes two pull-up transistors PU1 and PU2, two pull-down transistors PD1 and PD2, and two pass gates PG1 and PG2.

In some embodiments, the pull-up transistor PU1 includes the gate 30 (or the gate (G1) which connects to the contact structure 40D (or the node C1), the p-type oxide semiconductor layer 220 serving as the channel layer, the contact structure 40B connected to a first voltage ($V_{DD}$), and the contact structure 40 which connects to the gate 30B (or the gate G2). In some embodiments, the pull-down transistor PD1 includes the gate 30 (or the gate G1) which connects to the contact structure 40D (or the node C1), the n-type oxide semiconductor layer 210 serving as the channel layer, the contact structure 40A connected to a second voltage ($V_{SS}$), and the contact structure 40 which connects to the gate 30B (or the gate G2).

In some embodiments, the pull-up transistor PU2 includes the gate 30B (or the gate G2) which connects to the contact structure 40 (or the node C2), the p-type oxide semiconductor layer 220 serving as the channel layer, the contact structure 40B connected to the first voltage ($V_{DD}$), and the contact structure 40D which connects to the gate 30 (or the gate G1). In some embodiments, the pull-down transistor PD2 includes the gate 30B (or the gate G2) which connects to the contact structure 40 (or the node C2), the n-type oxide semiconductor layer 210 serving as the channel layer, the contact structure 40A connected to the second voltage ($V_{SS}$), and the contact structure 40D which connects to the gate 30 (or the gate G1).

In some embodiments, the first voltage ($V_{DD}$) may be a supply voltage (e.g., a positive voltage), and the second voltage ($V_{SS}$) may be a low voltage side or ground.

According to some embodiments of the present disclosure, with the design of the multilayer channel 20, each of the inverters of the SRAM (e.g., the semiconductor device 7) may include only one gate structure the gate 30 and the gate 30B) serving to cross-couple to the other inverter without routing additional conductive lines to connect the separate gate structures of the p-FET and the n-FET within one inverter. In addition, the pull-up transistors PU1 and PU2 and the pull-down transistors PD1 and PD2 can be stacked vertically, instead of arranged side-by-side, thereby a relatively complex 3D arrangements of various transistors within a device structure can be realized. Therefore, the flexibility of the design of device structures including various transistors can be increased.

Figure 8A:
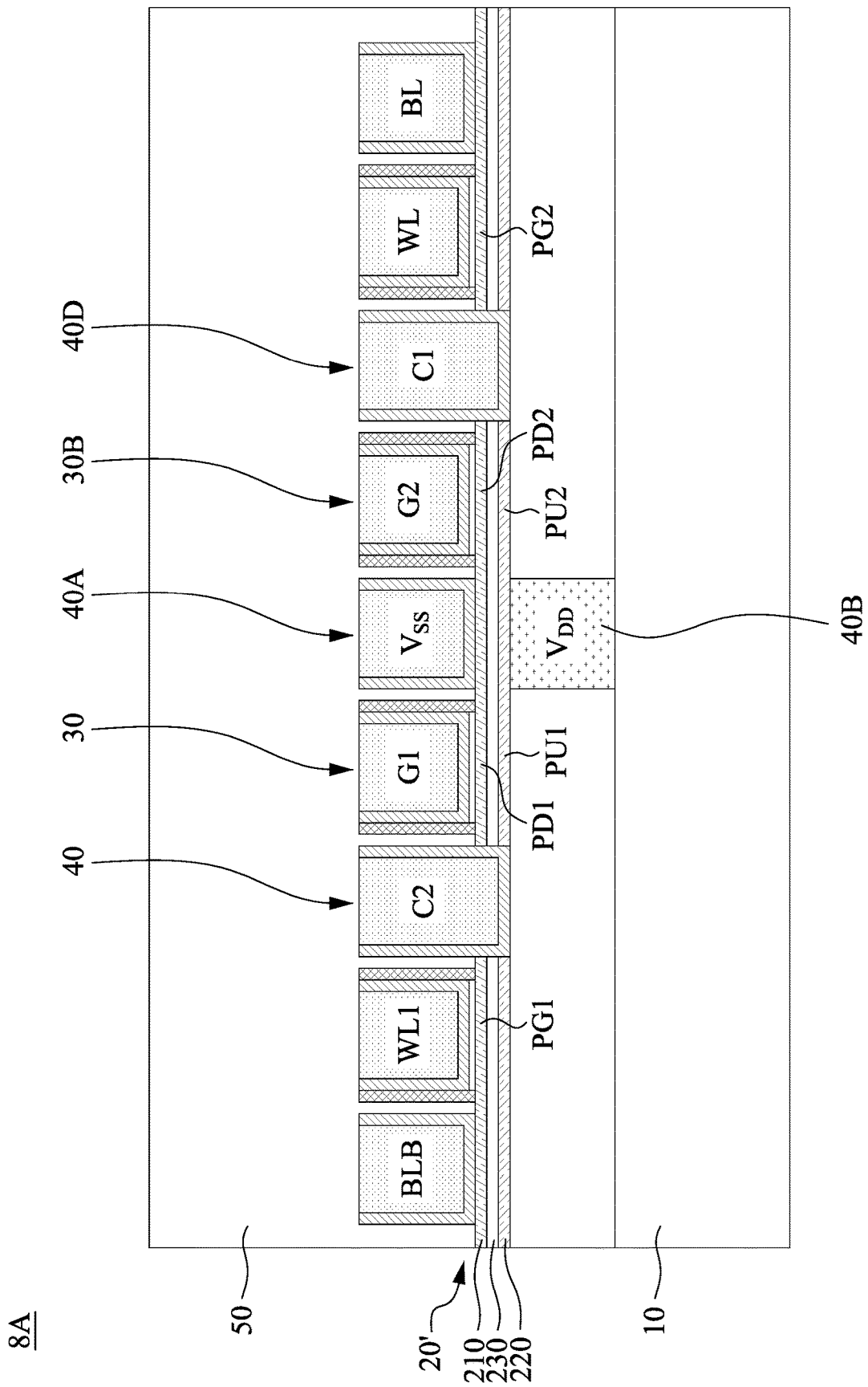
FIG. 8A is a cross-sectional view of a semiconductor device in accordance with some embodiments of the present disclosure.

FIG. 8A is a cross-sectional view of a semiconductor device 8A in accordance with some embodiments of the present disclosure. In some embodiments, the semiconductor device 8A is similar to the semiconductor device 7 in FIGS. 7A-7E, with differences therebetween as follows. Descriptions of similar components are omitted.

In some embodiments, the multilayer channel 20' further includes an insulating barrier 230 stacked between and in contact with the n-type oxide semiconductor layer 210 and the p-type oxide semiconductor layer 220. In some embodiments, the insulating barrier 230 separates the n-type oxide semiconductor layer 210 from the p-type oxide semiconductor layer 220. According to some embodiments of the present disclosure, the insulating barrier 230 can improve the electrical isolation between the n-type oxide semiconductor layer 210 and the p-type oxide semiconductor layer 220. Therefore, reduction of leakage (e.g., leakage from the $V_{DD}$ contact structure to the $V_{SS}$ contact structure) can be improved.

Figure 8B:
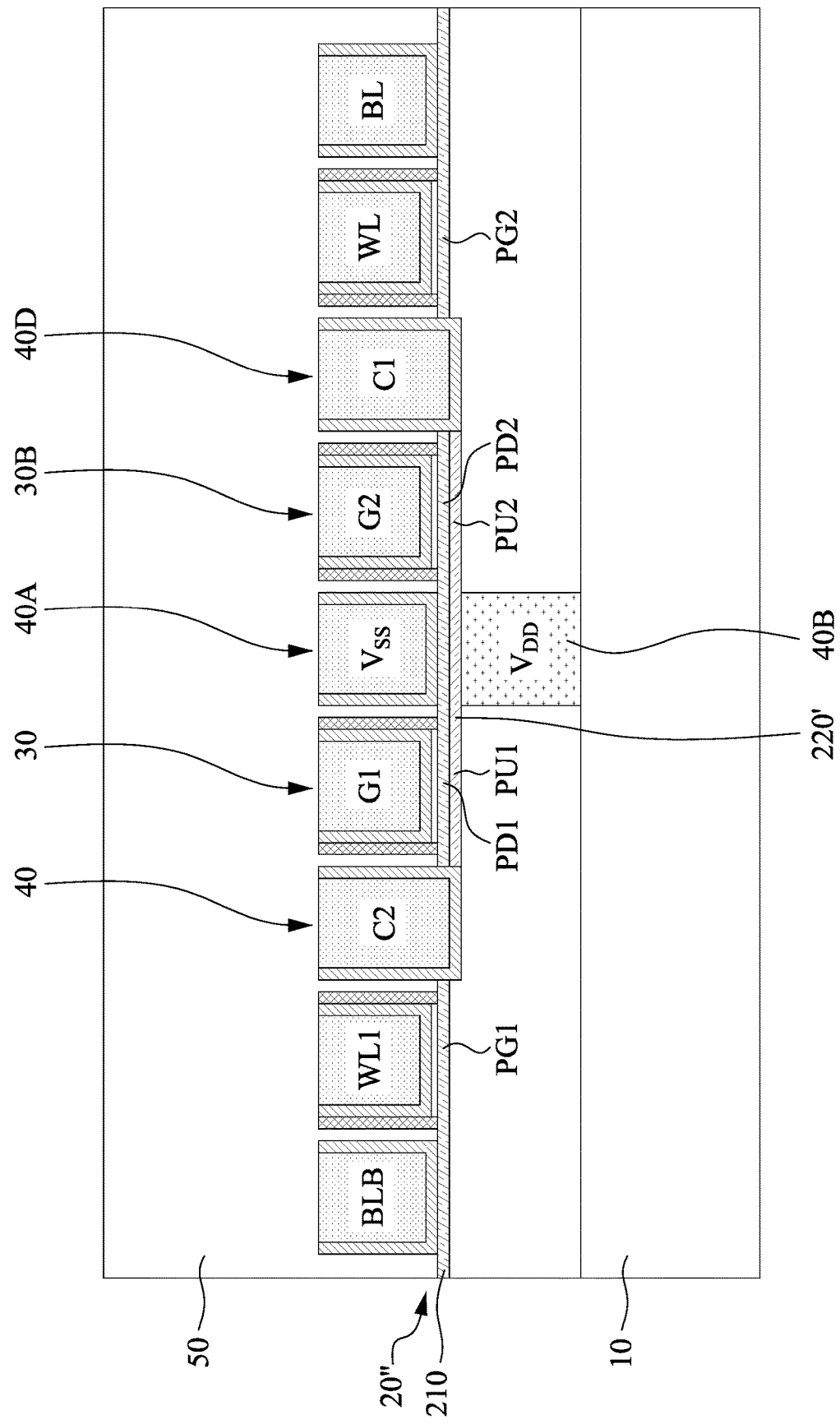
FIG. 8B is a cross-sectional view of a semiconductor device in accordance with some embodiments of the present disclosure.

FIG. 8B is a cross-sectional view of a semiconductor device 8B in accordance with some embodiments of the present disclosure. In some embodiments, the semiconductor device 8B is similar to the semiconductor device 7 in FIGS. 7A-7E, with differences therebetween as follows. Descriptions of similar components are omitted.

In some embodiments, the multilayer channel 20" includes an n-type oxide semiconductor layer 210 and a p-type oxide semiconductor layer 220' having a length less than that of the n-type oxide semiconductor layer 210. In some embodiments, the multilayer channel 20" may be free of the p-type oxide semiconductor layer 220' under the word lines WL and WL1 and the bit line contacts BL and BLB. In some embodiments, the p-type oxide semiconductor layer 220' extends between the contact structure 40 and the contact structure 40D.

FIGS. 9A to 9H are cross-sectional views of intermediate stages of a method of manufacturing a semiconductor device 1 in accordance with some embodiments of the present disclosure.

Figure 9A:
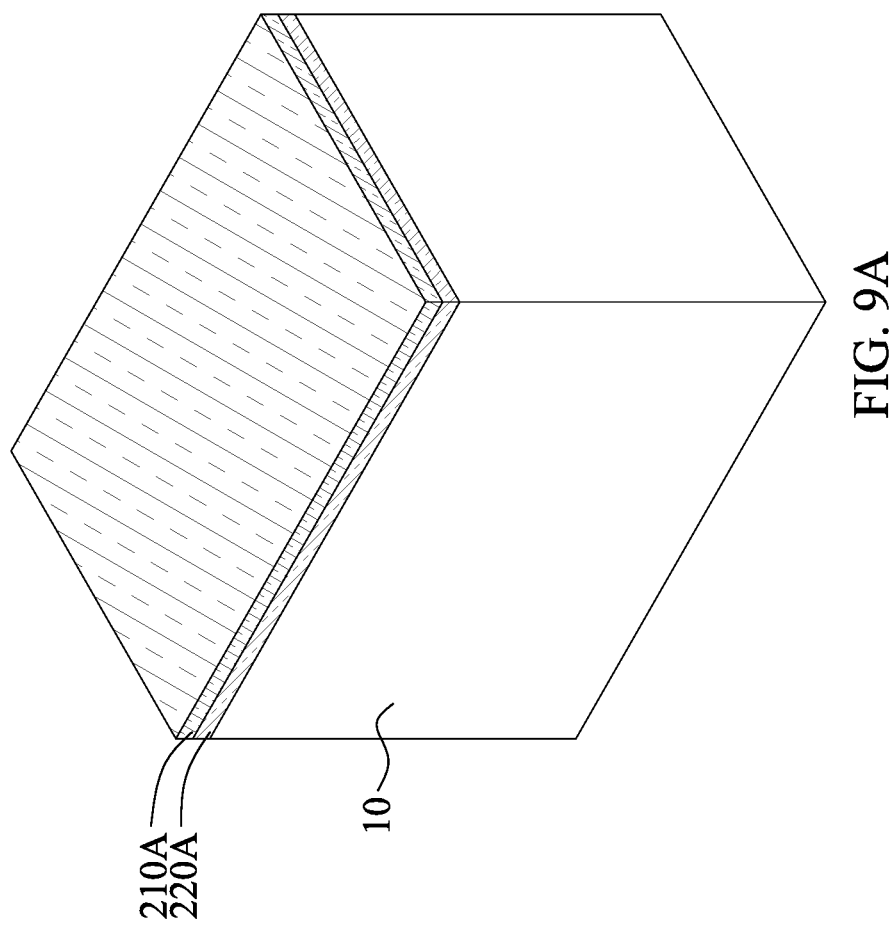

Referring to FIG. 9A, an n-type oxide semiconductor material 210A and a p-type oxide semiconductor material 220A may be formed stacked on each other over a substrate 10. In some embodiments, the n-type oxide semiconductor material 210A and the p-type oxide semiconductor material 220A may be formed by deposition, e.g., atomic layer deposition (ALD).

Referring to FIG. 9B, a patterning operation may be performed on the n-type oxide semiconductor material 210A and the p-type oxide semiconductor material 220A to form an n-type oxide semiconductor material 210B and a p-type oxide semiconductor material 220B. In some embodiments, the patterning operation may be performed by etching.

Figure 9C:
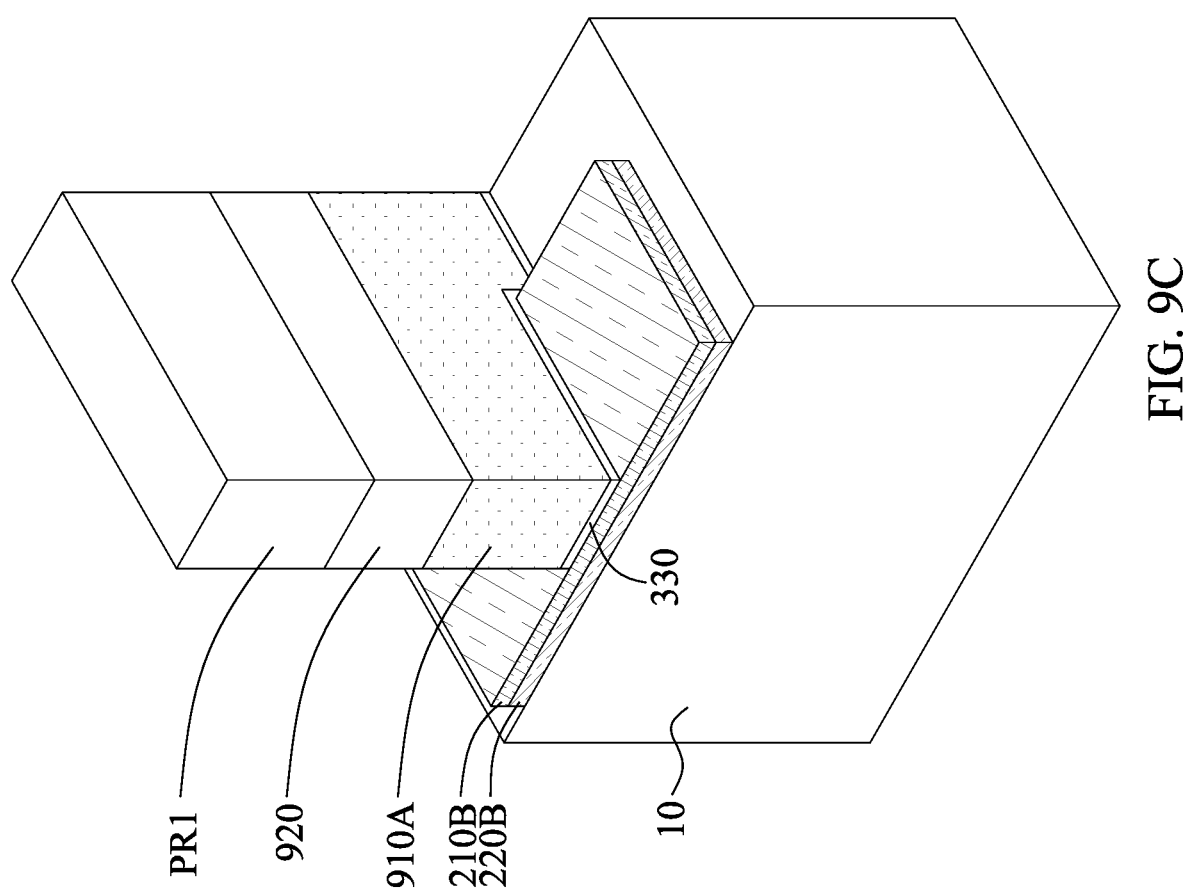

Referring to FIG. 9C, a dummy gate structure may be formed on the n-type oxide semiconductor material 210B and a p-type oxide semiconductor material 220B. In some embodiments, the dummy gate structure includes a dielectric layer 330, a dummy gate 910A on the dielectric layer 330, a hardmask 920 on the dummy gate 910A, and a photoresist PR1 on the hardmask 920. The dummy gate structure may be formed by using the photoresist PR1 to form the patterned hardmask 920 on a dummy gate material and a dielectric material over the substrate 10, and patterning the dummy gate material and the dielectric material according to the patterned hardmask 920 to form the dummy gate 910A and the dielectric layer 330. The dummy gate 910A may be or include amorphous silicon. The hardmask 920 may be or include silicon oxide and may be formed by deposition, e.g., PECVD.

Figure 9D:
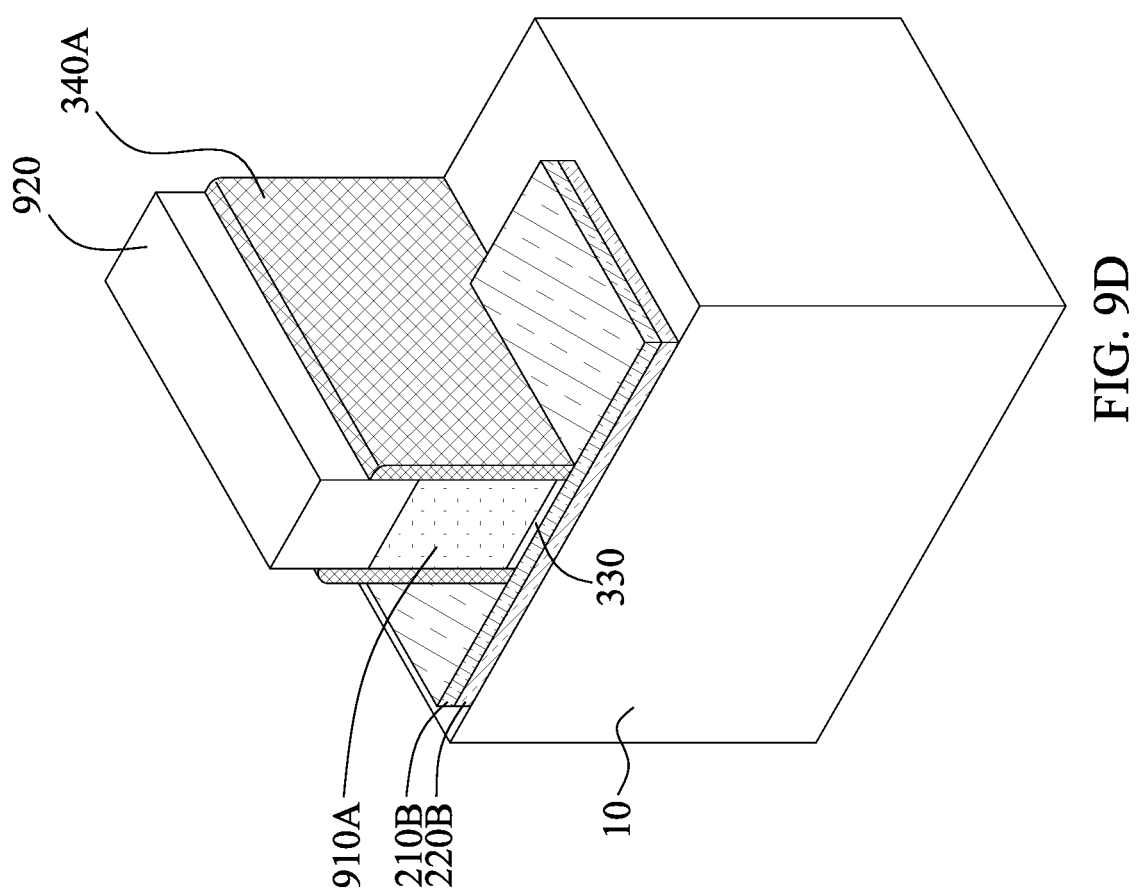

Referring to FIG. 9D, the photoresist PR1 may be removed, and a spacer 340A may be formed on lateral sides of the dummy gate 910A, in some embodiments, the spacer 340A may be formed by deposition, e.g., low-pressure CVD (LPCVD).

Figure 9E:
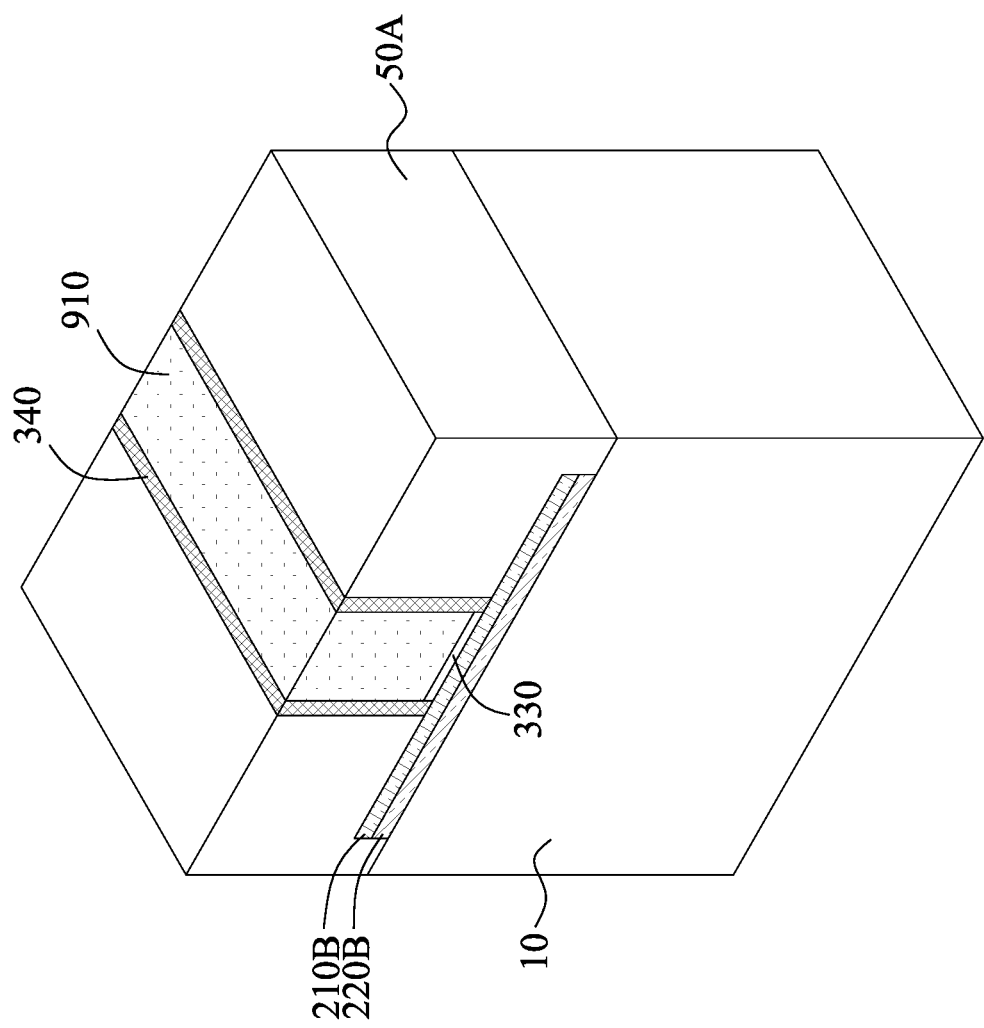

Referring to FIG. 9E, a passivation layer 50A may be formed over the dummy gate 910A, the spacer 340A, the n-type oxide semiconductor material 210B, and the p-type oxide semiconductor material 220B. In some embodiments, a planarization operation may be performed to remove the hardmask 920 and form substantially planar upper surfaces of the passivation layer 50A, the spacer 340, and the dummy gate 910. The passivation layer 50A may include a dielectric material, e.g., silicon oxide. The passivation layer 50A may be formed by deposition, e.g., high-density plasma CND (HDPCVD).

Figure 9F:
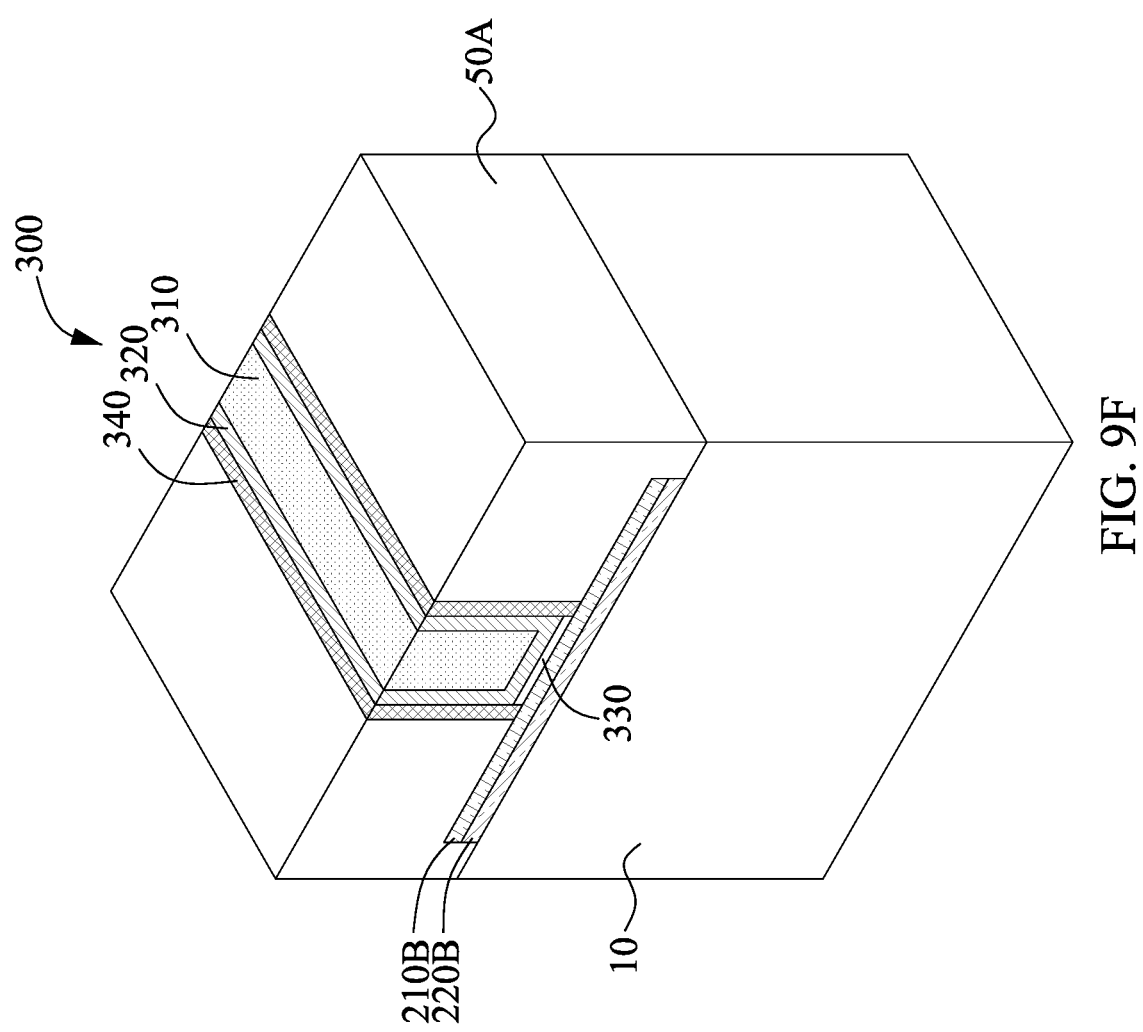

Referring to FIG. 9F, a gate 300 may be formed over the n-type oxide semiconductor material 210B and the p-type oxide semiconductor material 220B. In sonic embodiments, the gate 300 includes a conductive layer 310, a liner 320, the dielectric layer 330, and the spacer 340. In some embodiments, the conductive layer 310 and the liner 320 may be formed by a replacement gate process, by which the dummy gate 910 is removed to form a trench defined by the dielectric layer 330 and the spacer 340 followed by filling the conductive layer 310 and the liner 320 into the trench.

Figure 9G:
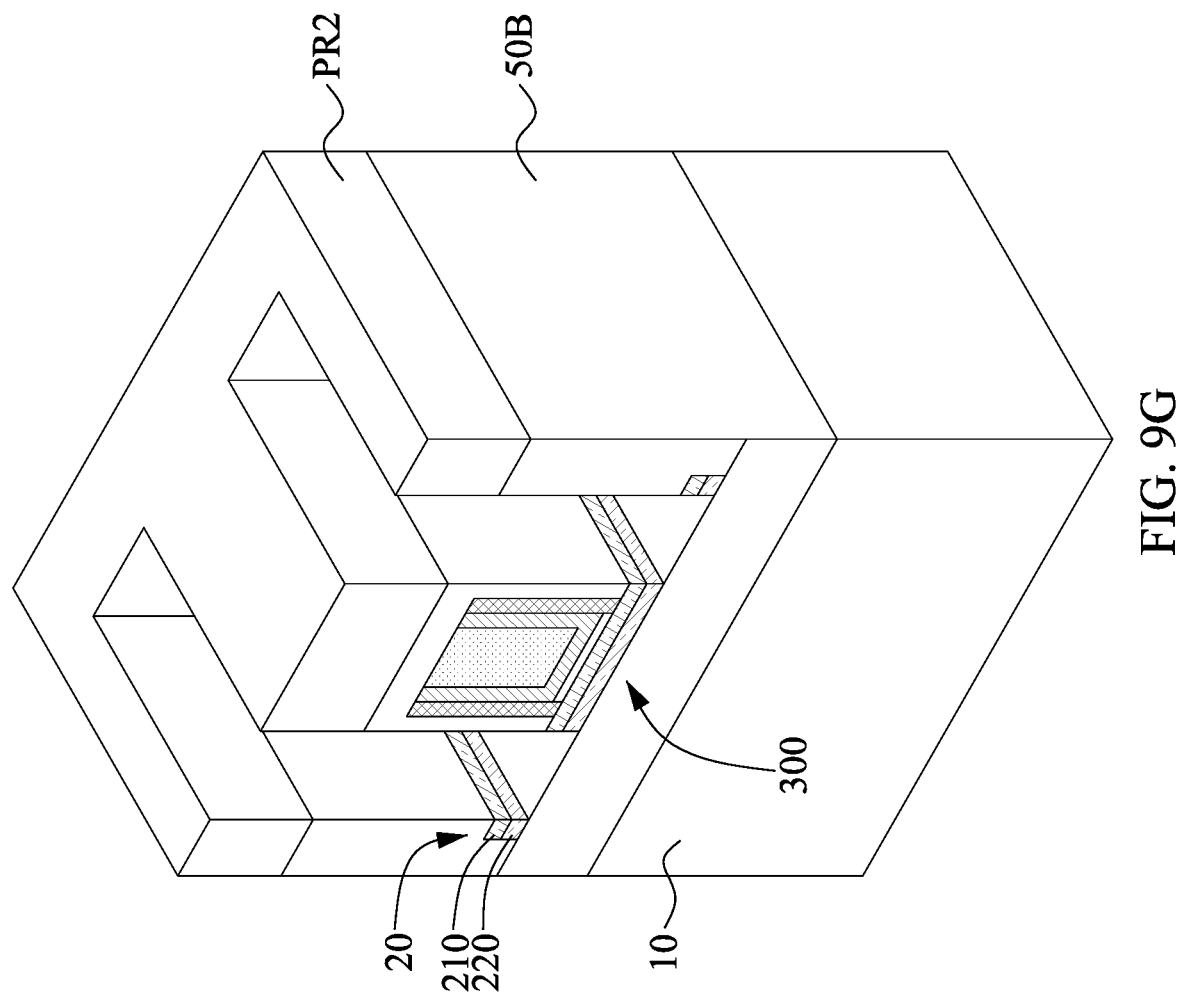

Referring to FIG. 9G, the n-type oxide semiconductor material 210B and the p-type oxide semiconductor material 220B may be patterned to form openings (or trenches) exposing portions of the substrate 10. In some embodiments, a photoresist PR2 may be used to pattern the passivation layer 50A, the n-type oxide semiconductor material 210B, and the p-type oxide semiconductor material 220B to form a passivation layer 50B, an n-type oxide semiconductor layer 210, and a p-type oxide semiconductor layer 220 which define the openings or trenches.

Figure 9H:
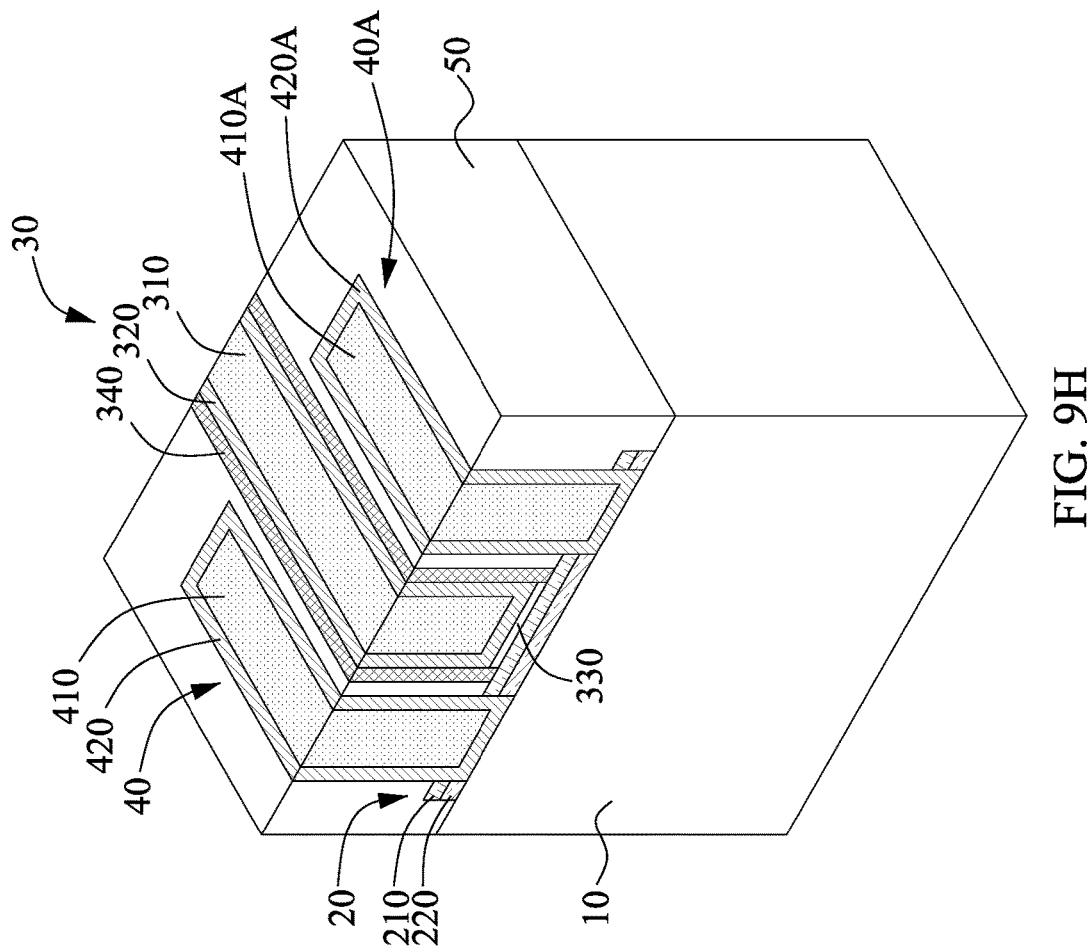

Referring to FIG. 9H, the photoresist PR2 may be removed, and contact structures 40 and 40A may be formed on the exposed portions of the substrate 10. In some embodiments, the contact structures 40 and 40A are formed in the openings or trenches. In some embodiments, liner materials and conductive materials may be formed in the openings or trenches, and a planarization operation may be performed on the liner materials and the conductive materials to form the contact structures 40 and 40A. In some embodiments, the planarization operation is performed on the passivation layer 50B and the gate 300 form a passivation layer 50 and a gate 30. As such, the semiconductor device 1 illustrated in FIGS. 1A-1B is formed.

FIGS. 10A to 10I are cross-sectional views of intermediate stages of a method of manufacturing a semiconductor device 2 in accordance with some embodiments of the present disclosure.

Figure 10A:
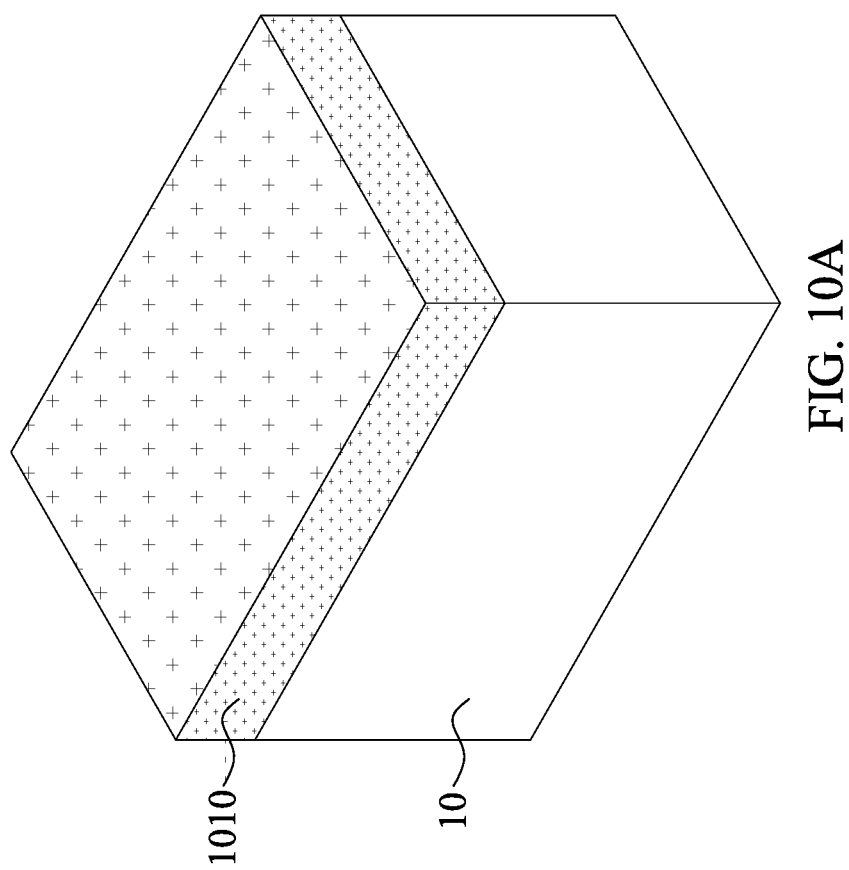
FIGS. 10A to 10I are cross-sectional views of intermediate stages of a method of manufacturing a semiconductor device in accordance with some embodiments of the present disclosure.

Referring to FIG. 10A, a conductive layer 1010 may be formed over a substrate 10. The conductive layer 1010 may be formed by deposition.

Figure 10B:
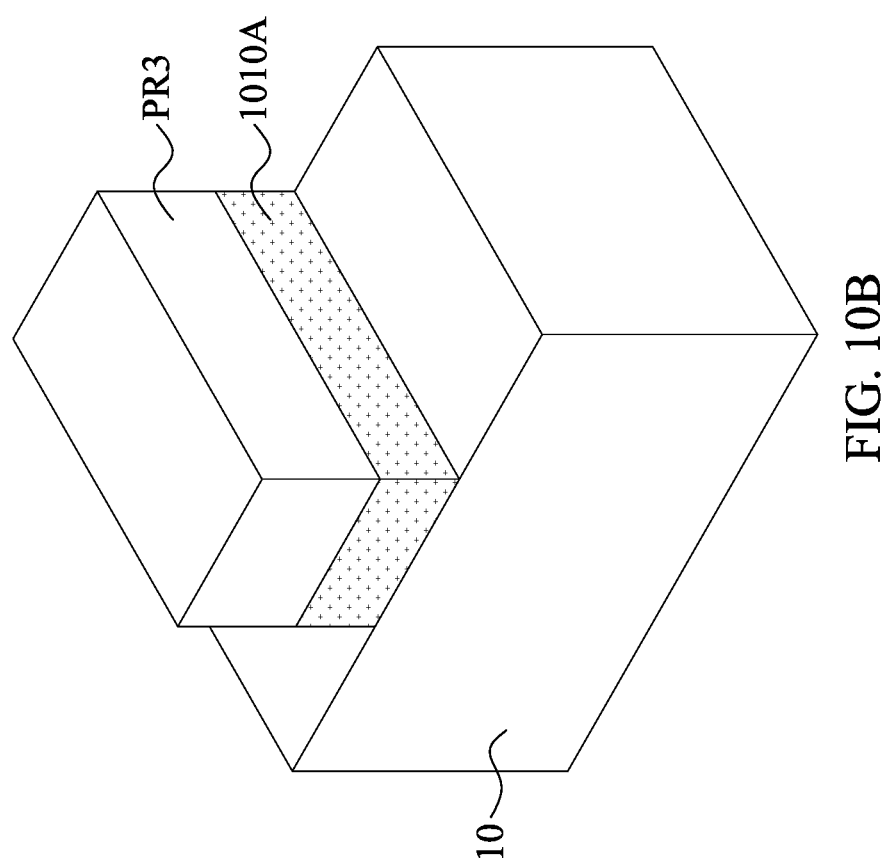

Referring to FIG. 10B, a patterning operation may be performed on the conductive layer 1010 to form a conductive layer 1010A. In some embodiments, the conductive layer 1010A may be formed according to a patterned photoresist PR3.

Figure 10C:
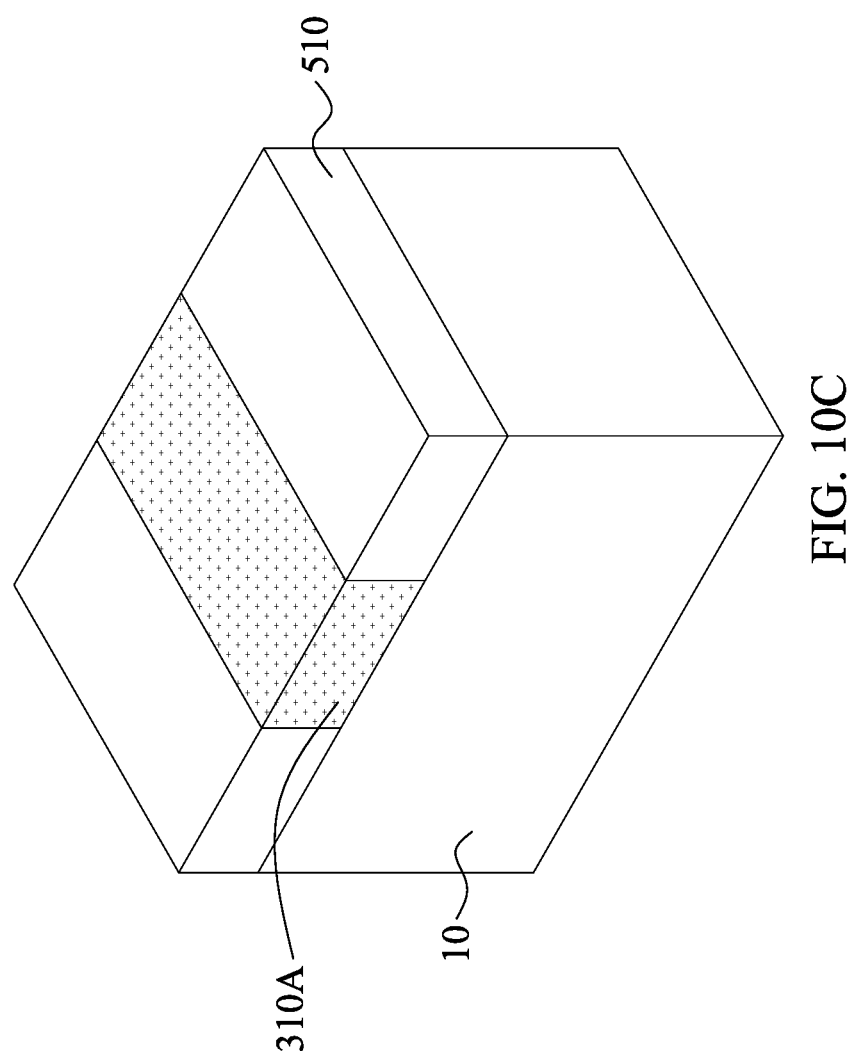

Referring to FIG. 10C, a gate 30A may be formed over the substrate 10. In some embodiments, the photoresist PR3 is removed, a passivation layer may be formed over the conductive layer 1010A, and a planarization operation may be performed to form substantially planar upper surfaces of the passivation layer 510 and the conductive layer 30A. The passivation layer 510 may include a dielectric material and may be formed by deposition, e.g., HDPCVD.

Figure 10D:
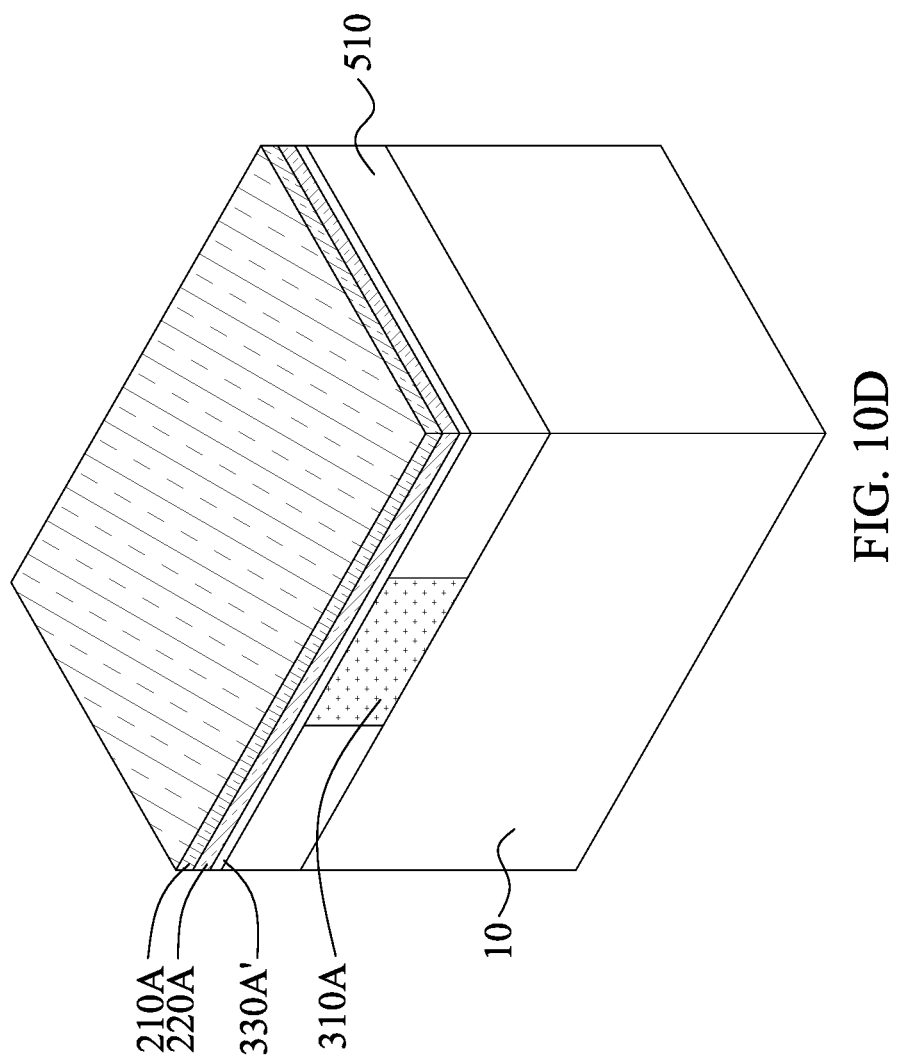

Referring to FIG. 10D, a dielectric layer 330A' may be formed on the substantially planar upper surfaces of the passivation layer 510 and the conductive layer 30A, and an n-type oxide semiconductor material 210A and a p-type oxide semiconductor material 220A may be formed stacked on each other on the dielectric layer 330A'. In some embodiments, the n-type oxide semiconductor material 210A and the p-type oxide semiconductor material 220A may be formed by deposition, e.g., ALD, in some embodiments, the dielectric layer 330A' may be formed by deposition.

Figure 10E:
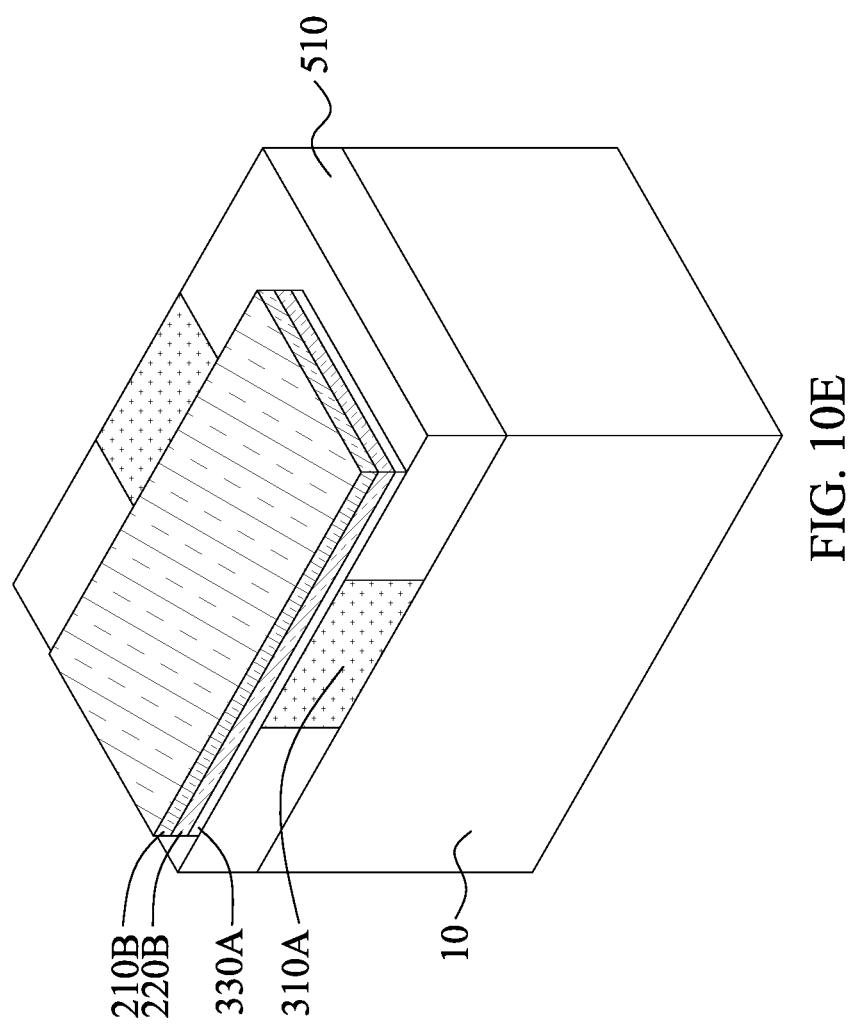

Referring to FIG. 10E, a patterning operation may be performed on the dielectric layer 330A', the n-type oxide semiconductor material 210A, and the p-type oxide semiconductor material 220A to form a dielectric layer 330A, an n-type oxide semiconductor material 210B, and a p-type oxide semiconductor material 220B. In some embodiments, the patterning operation may be performed by etching.

Figure 10F:
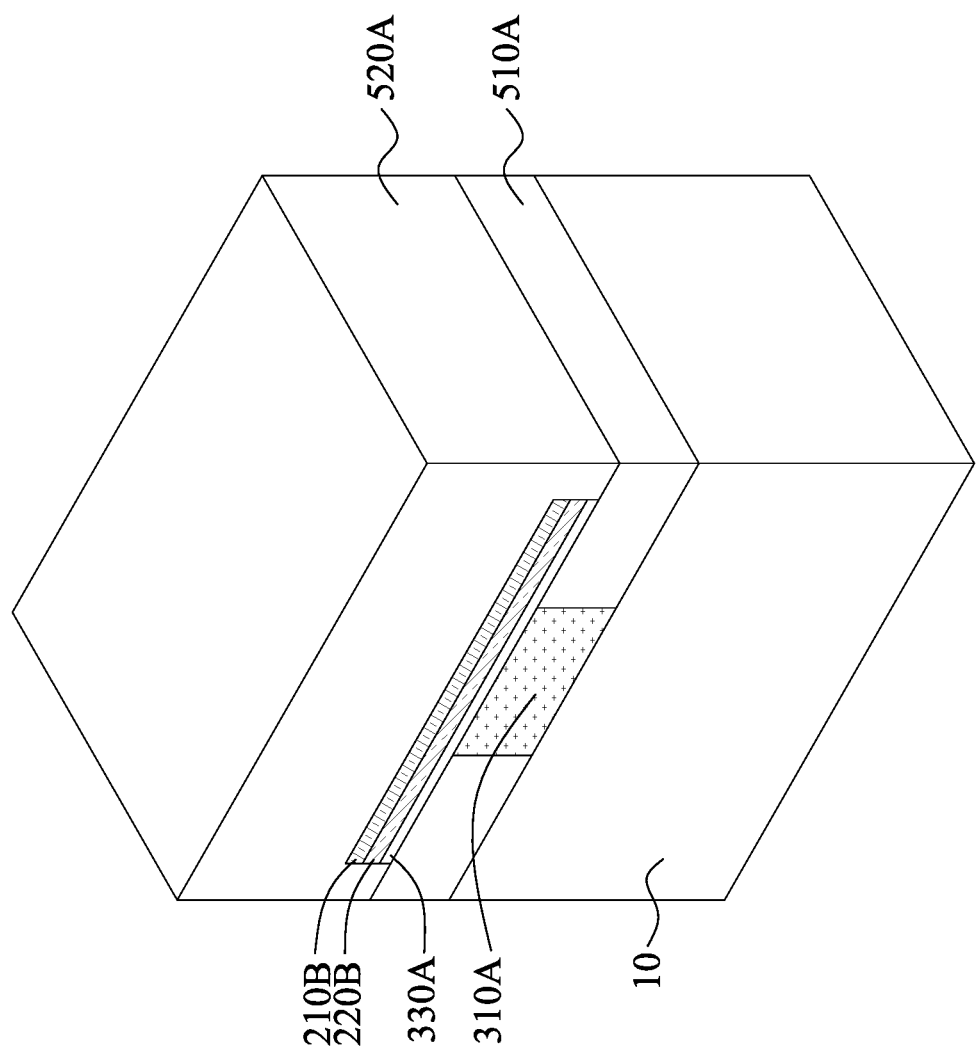

Referring to FIG. 10F, a passivation layer 520 may be formed over the passivation layer 510 and covering the dielectric layer 330A, the n-type oxide semiconductor material 210B, and the p-type oxide semiconductor material 220B. The passivation layer 520 may include a dielectric material and may be formed by deposition, e.g., HDPCVD.

Figure 10G:
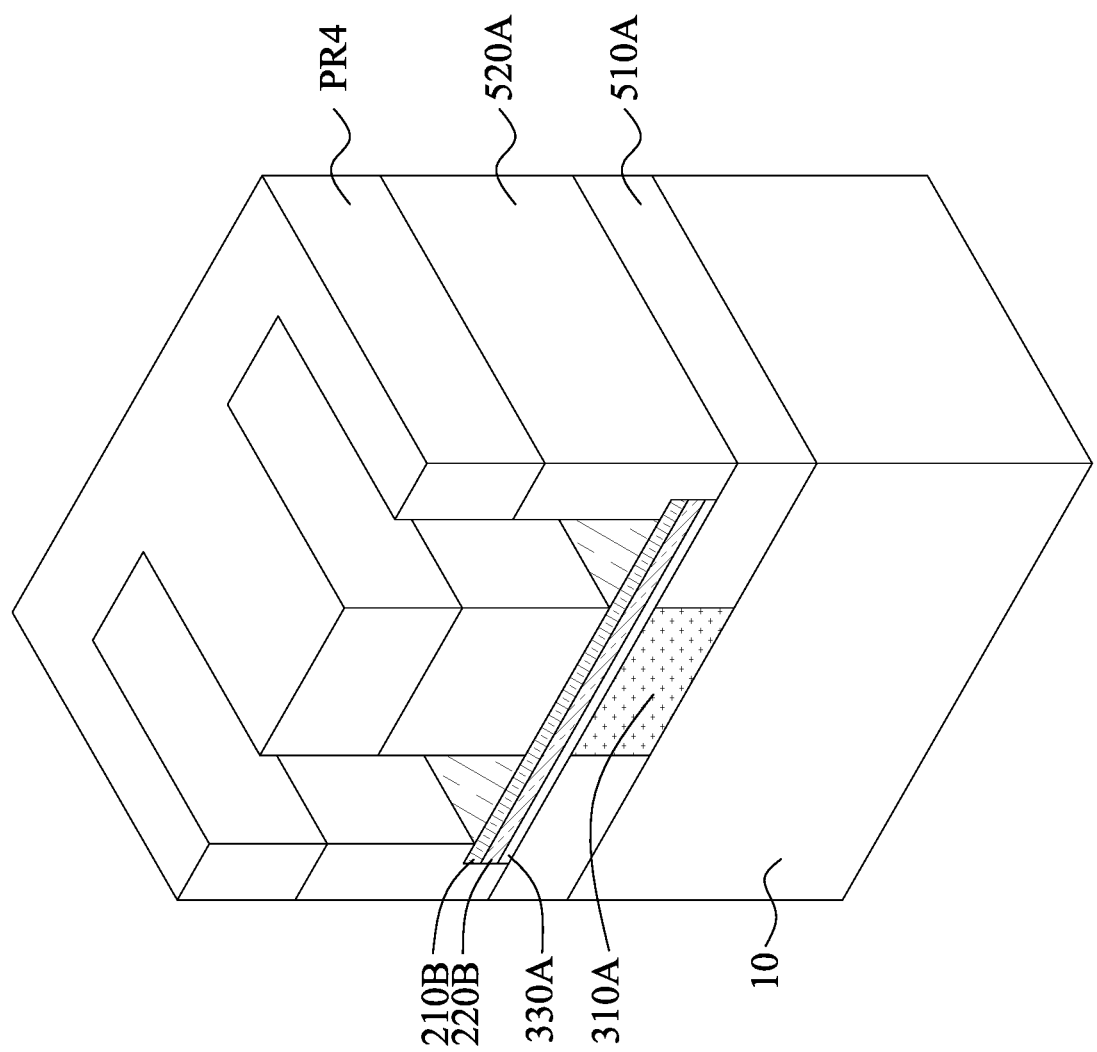

Referring to FIG. 10G, the passivation layer 520 may be patterned to form openings (or trenches) exposing portions of the n-type oxide semiconductor material 210B. In some embodiments, a photoresist PR4 may be used to pattern the passivation layer 520 to form a passivation layer 520A which define the openings or trenches.

Figure 10H:
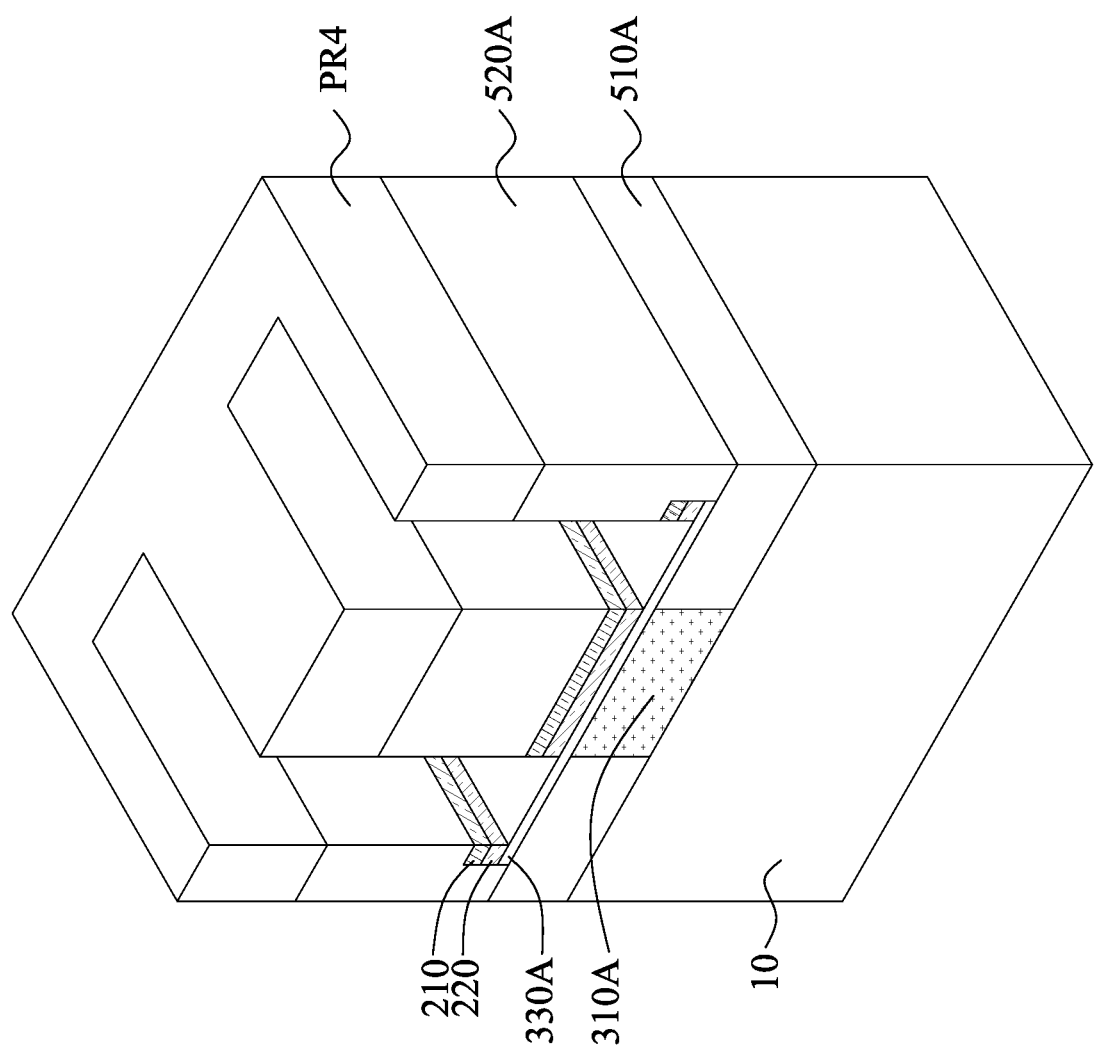

Referring to FIG. 10H, the n-type oxide semiconductor material 210B and the p-type oxide semiconductor material 220B may be patterned to form openings (or trenches) exposing portions of the dielectric layer 330A. In some embodiments, the n-type oxide semiconductor material 210B and the p-type oxide semiconductor material 220B are patterned according to the openings or trenches of the passivation layer 520A to form an n-type oxide semiconductor layer 210 and a p-type oxide semiconductor layer 220. In some embodiments, portions of the n-type oxide semiconductor material 210B and the p-type oxide semiconductor material 220B corresponding to the openings or trenches of the passivation layer 520A are removed.

Figure 10I:
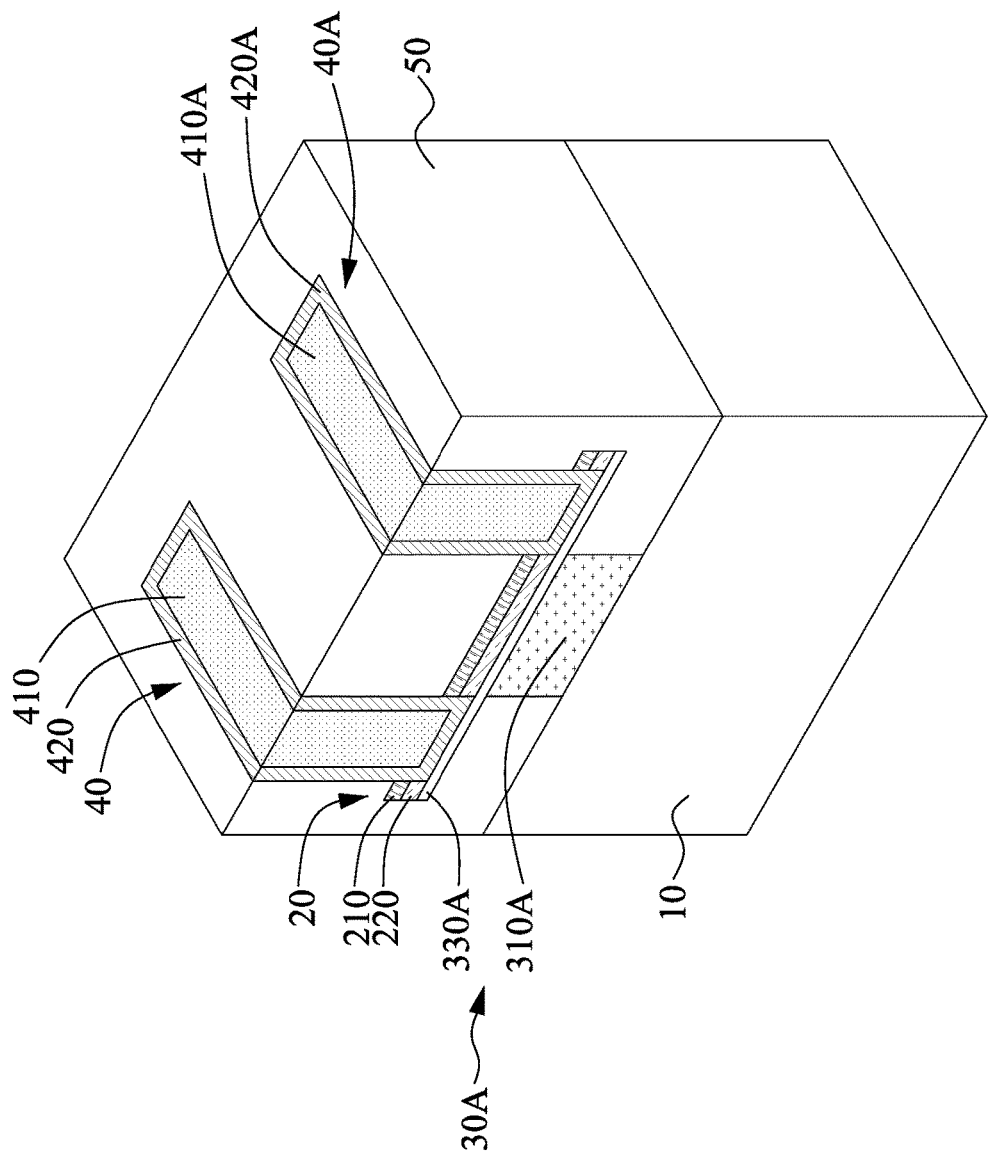

Referring to FIG. 10I, the photoresist PR4 may be removed, and contact structures 40 and 40A may be formed on the exposed portions of the dielectric layer 330A. In some embodiments, the contact structures 40 and 40A are formed in the openings or trenches defined by the passivation layer 520A, the n-type oxide semiconductor layer 210, and the p-type oxide semiconductor layer 220. In some embodiments, liner materials and conductive materials may be formed in the openings or trenches, and a planarization operation may be performed on the liner materials and the conductive materials to form the contact structures 40 and 40A and the passivation layer 520A, and the planarized passivation layer 520A together with the passivation layer 510A form a passivation layer 50. As such, the semiconductor device 2 illustrated in FIGS. 2A-2B is formed.

FIGS. 11A to 11M are cross-sectional views of intermediate stages of a method of manufacturing a semiconductor device 4 in accordance with some embodiments of the present disclosure.

Referring to FIG. 11A, a conductive layer 1010 may be formed over a substrate 10. The conductive layer 1010 may be formed by deposition.

Referring to FIG. 11B, a patterning operation may be performed on the conductive layer 1010 to form a conductive layer 1010A. In some embodiments, the conductive layer 1010A may be formed according to a patterned photoresist PR5.

Figure 11C:
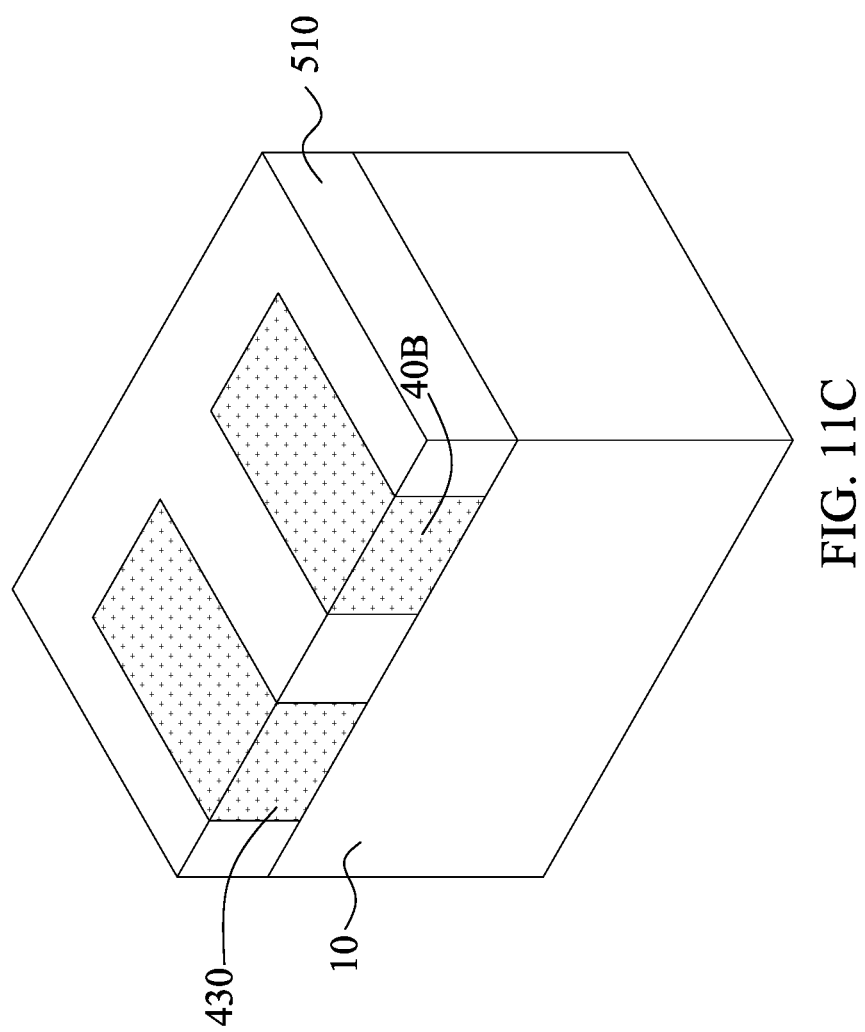

Referring to FIG. 11C, conductive layers (i.e. a conductive layer 430 and a gate 40B) may be formed over the substrate 10. In some embodiments, the photoresist PR5 is removed, a passivation layer may be formed over the conductive layer 1010A, and a planarization operation may be performed to form substantially planar upper surfaces of the passivation layer 510 and the conductive layers. The passivation layer 510 may include a dielectric material and may be formed by deposition, e.g., HDPCVD.

Figure 11D:
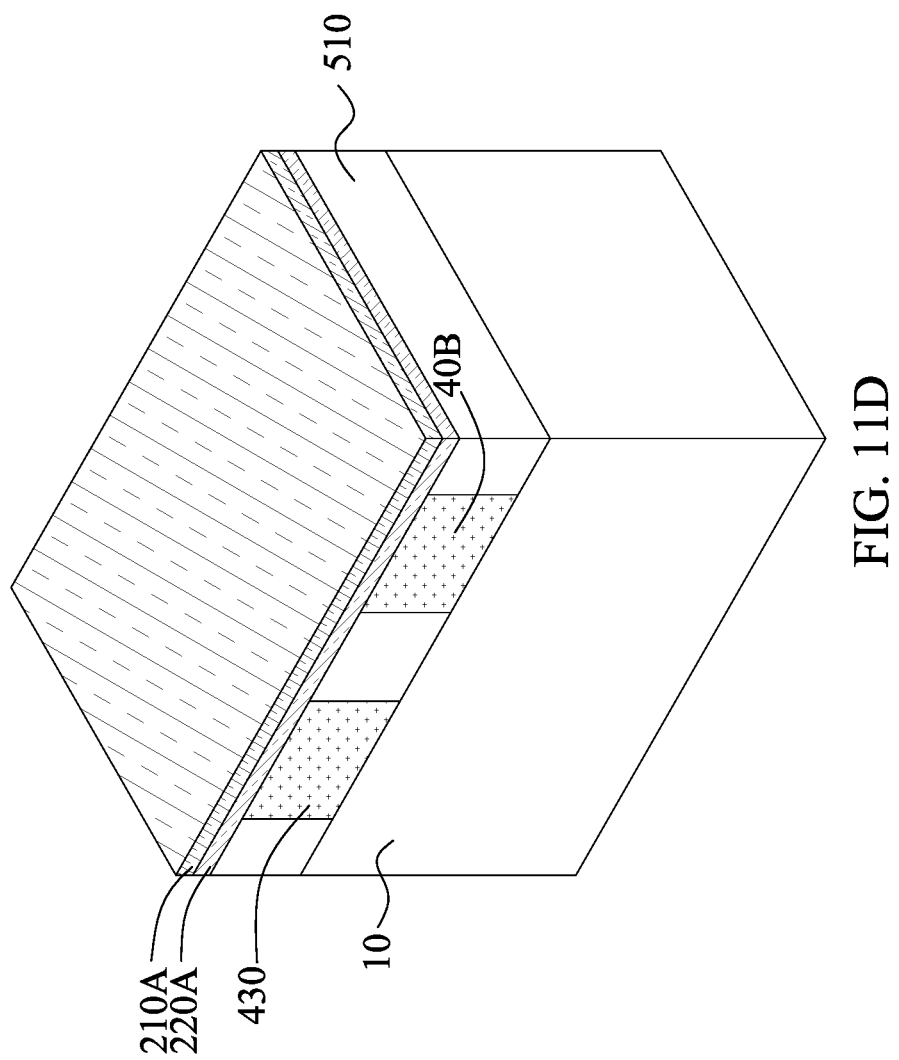

Referring to FIG. 11D, an n-type oxide semiconductor material 210A and a p-type oxide semiconductor material 220A may be formed stacked on each other on the substantially planar upper surfaces of the passivation layer 510 and the conductive layers (i.e. the conductive layer 430 and the gate 40B). In some embodiments, the n-type oxide semiconductor material 210A and the p-type oxide semiconductor material 220A may be formed by deposition, e.g., ALD.

Figure 11E:
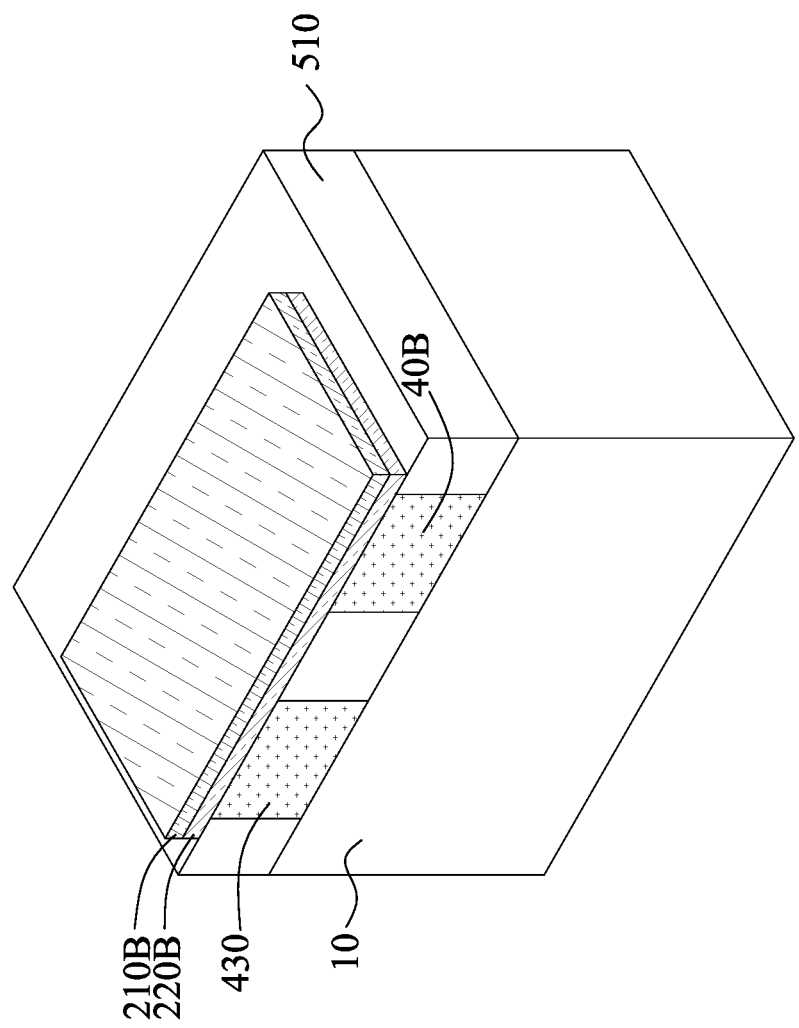

Referring to FIG. 11E, a patterning operation may be performed on the n-type oxide semiconductor material 210A and the p-type oxide semiconductor material 220A to form an n-type oxide semiconductor material 210B and a p-type oxide semiconductor material 220B. In some embodiments, the patterning operation may be performed by etching.

Figure 11F:
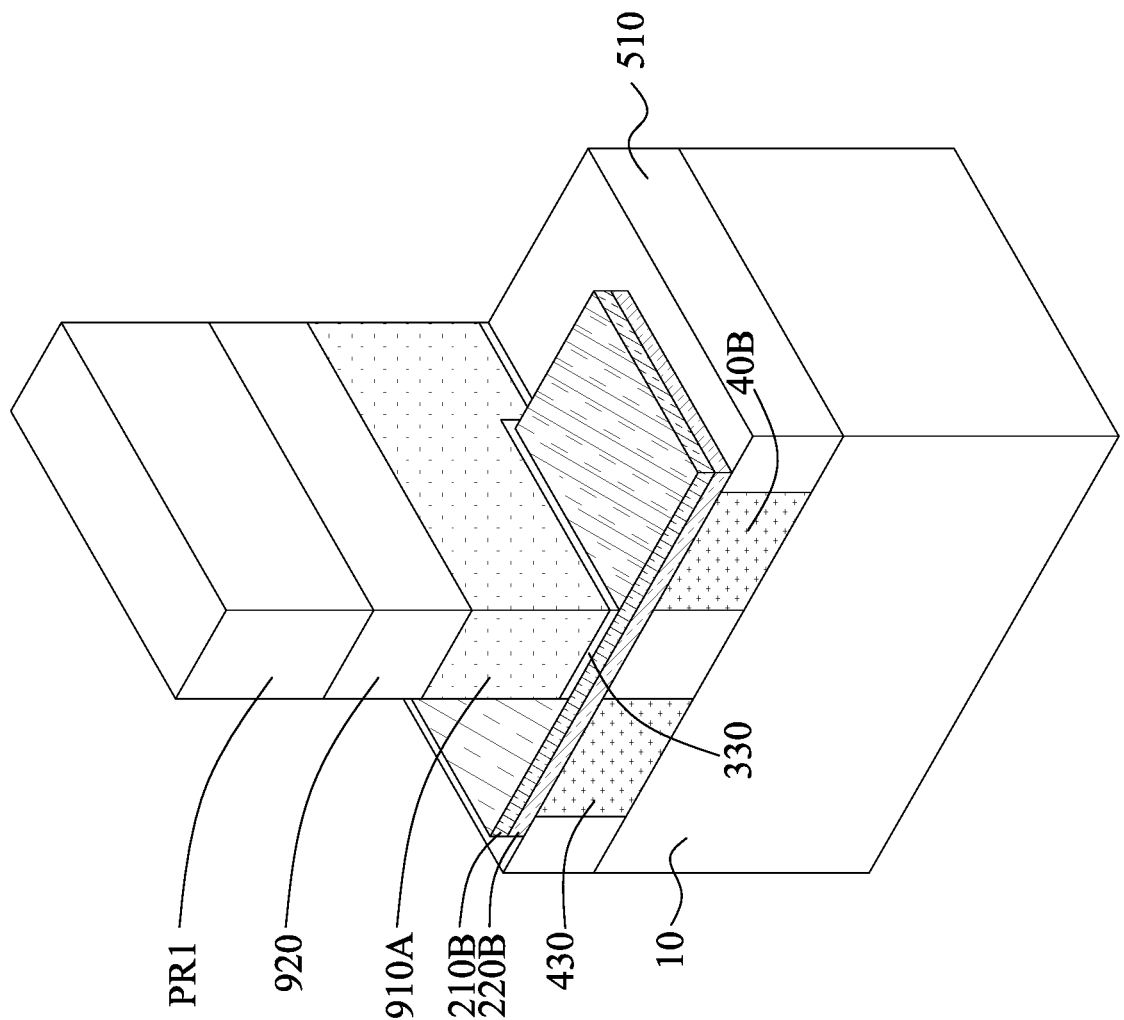

Referring to FIG. 11F, a dummy gate structure may be formed on the n-type oxide semiconductor material 210B and a p-type oxide semiconductor material 220B. In some embodiments, the dummy gate structure includes a dielectric layer 330, a dummy gate 910A on the dielectric layer 330, a hardmask 920 on the dummy gate 910A, and a photoresist PR1 on the hardmask 920. The dummy gate structure may be formed by using the photoresist PR1 to form the patterned hardmask 920 on a dummy gate material and a dielectric material over the substrate 10, and patterning the dummy gate material and the dielectric material according to the patterned hardmask 920 to form the dummy gate 910A and the dielectric layer 330. The dummy gate 910A may be or include amorphous silicon. The hardmask 920 may be formed by deposition, e.g., PECVD.

Figure 11G:
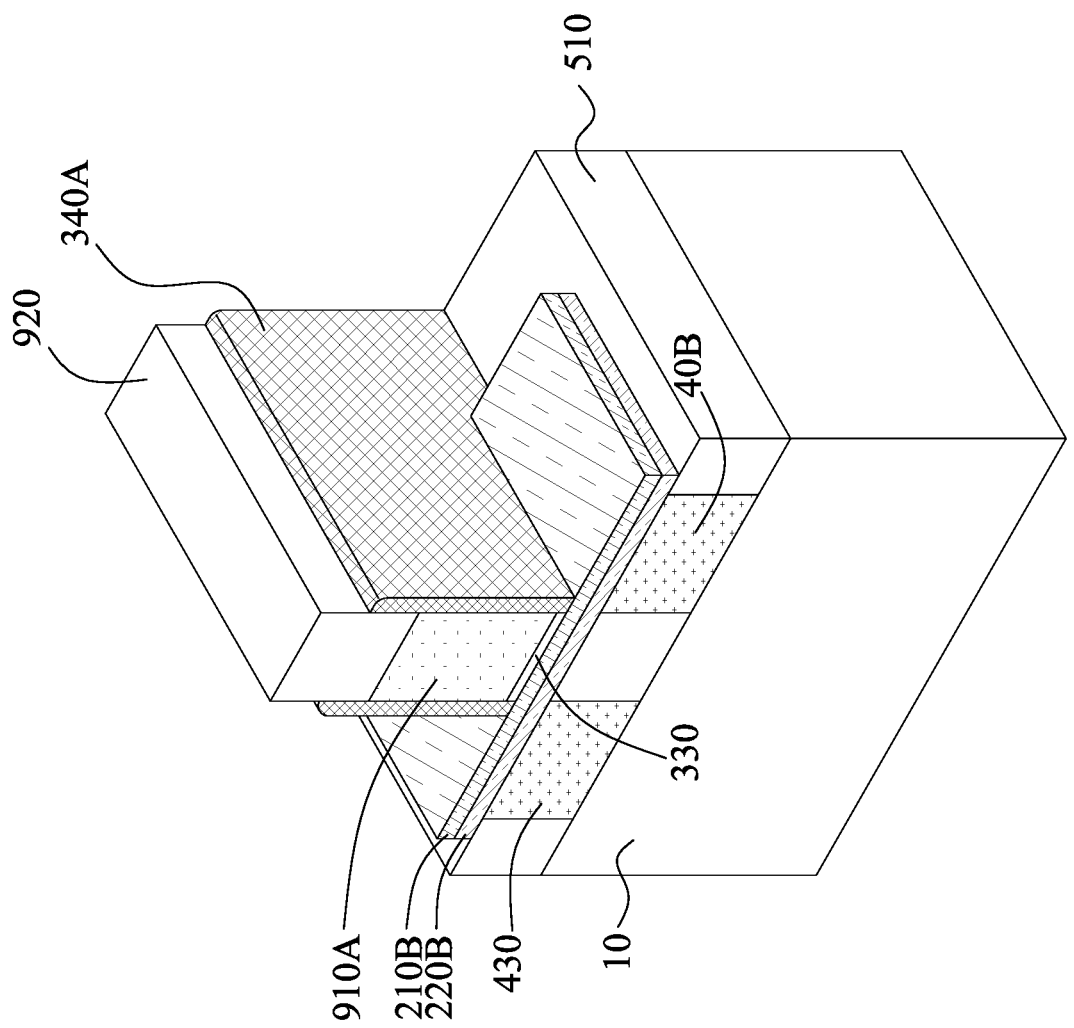

Referring to FIG. 11G, the photoresist PR1 may be removed, and a spacer 340A may be formed on lateral sides of the dummy gate 910A. In some embodiments, the spacer 340A may be formed by deposition, e.g., LPCVD.

Figure 11H:
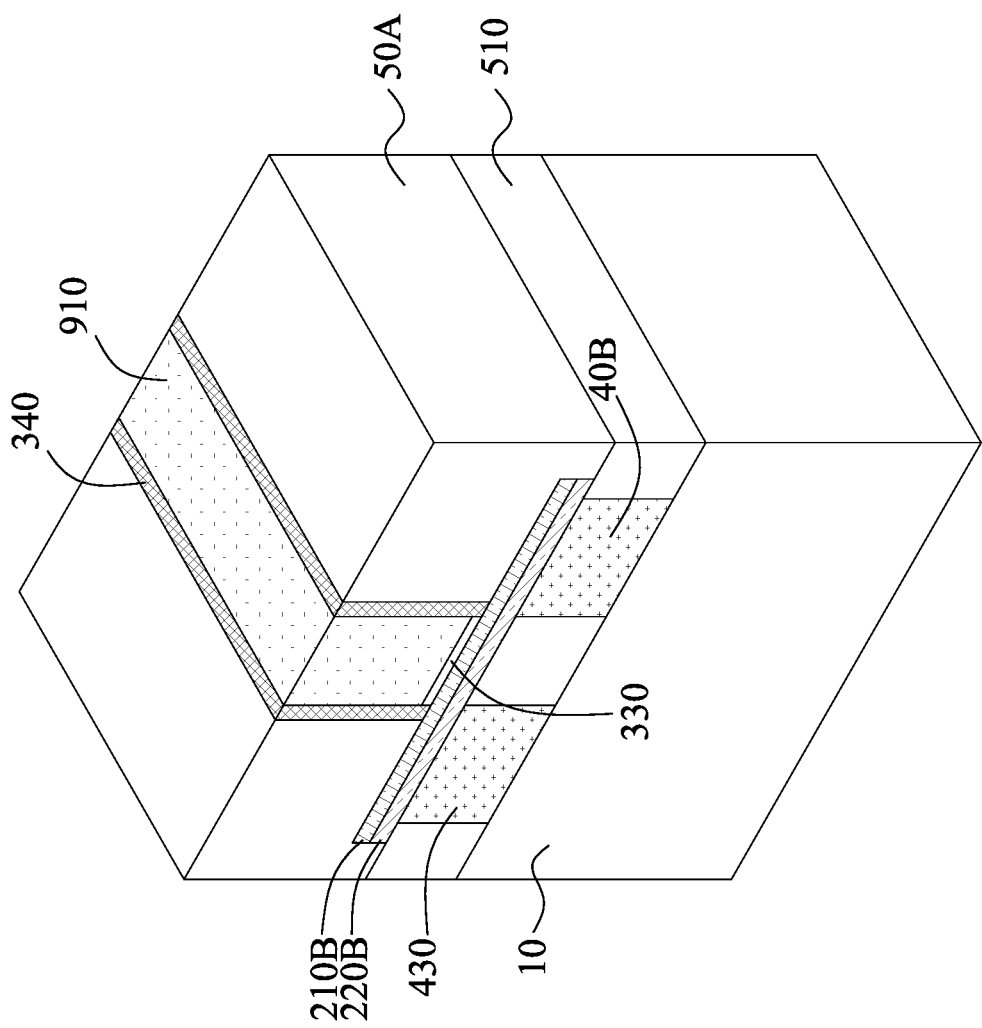

Referring to FIG. 11H, a passivation layer 50A may be formed over the dummy gate 910A, the spacer 340A, the n-type oxide semiconductor material 210B, and the p-type oxide semiconductor material 220B. In some embodiments, a planarization operation may be performed to remove the hardmask 920 and form substantially planar upper surfaces of the passivation layer 50A, the spacer 340, and the dummy gate 910. The passivation layer 50A may include a dielectric material, e.g., silicon oxide. The passivation layer 50A may be formed by deposition, e.g., HDPCVD.

Figure 11I:
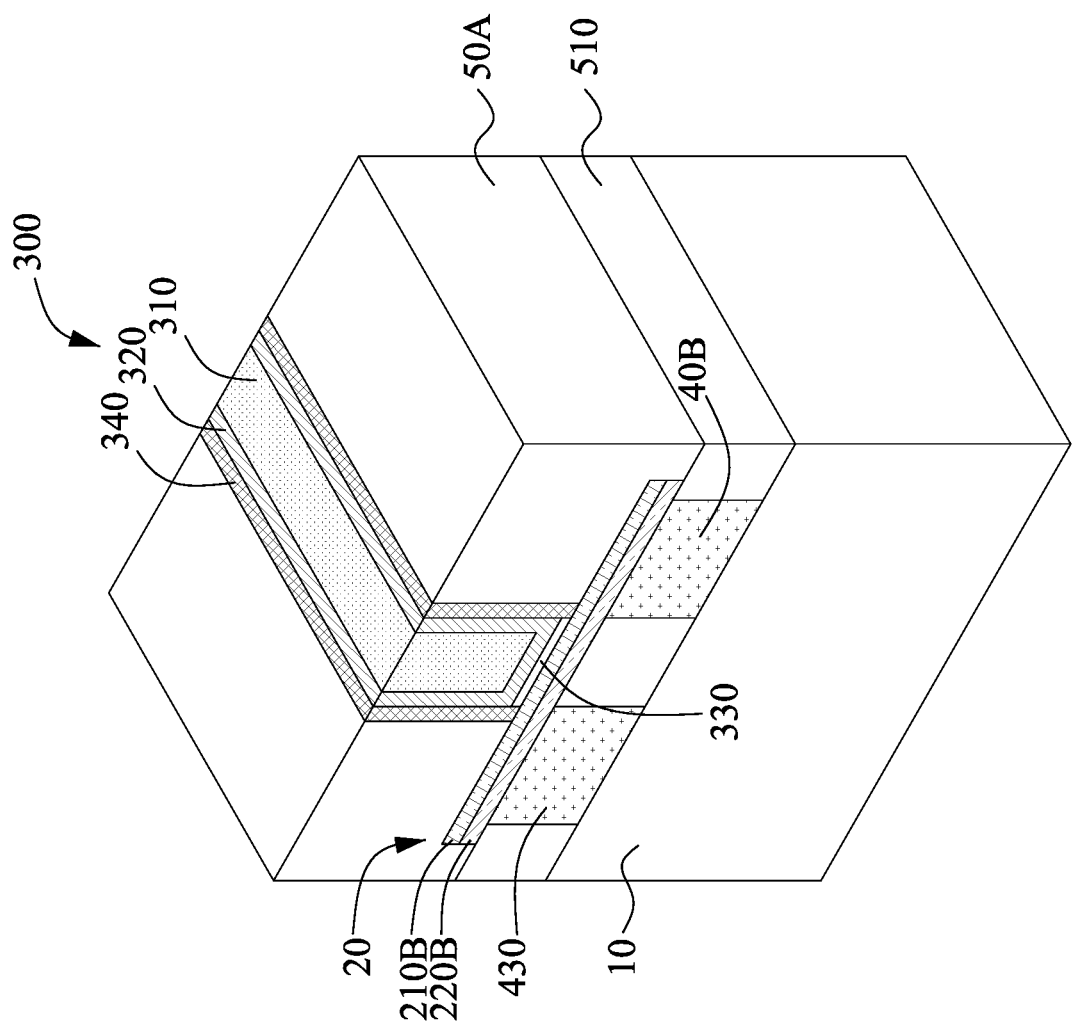

Referring to FIG. 11I, a gate 300 may be formed over the n-type oxide semiconductor material 210B and the p-type oxide semiconductor material 220B. In some embodiments, the gate 300 includes a conductive layer 310, a liner 320, the dielectric layer 330, and the spacer 340. In some embodiments, the conductive layer 310 and the liner 320 may be formed by a replacement gate process, by which the dummy gate 910 is removed to form a trench defined by the dielectric layer 330 and the spacer 340 followed by filling the conductive layer 310 and the liner 320 into the trench.

Figure 11J:
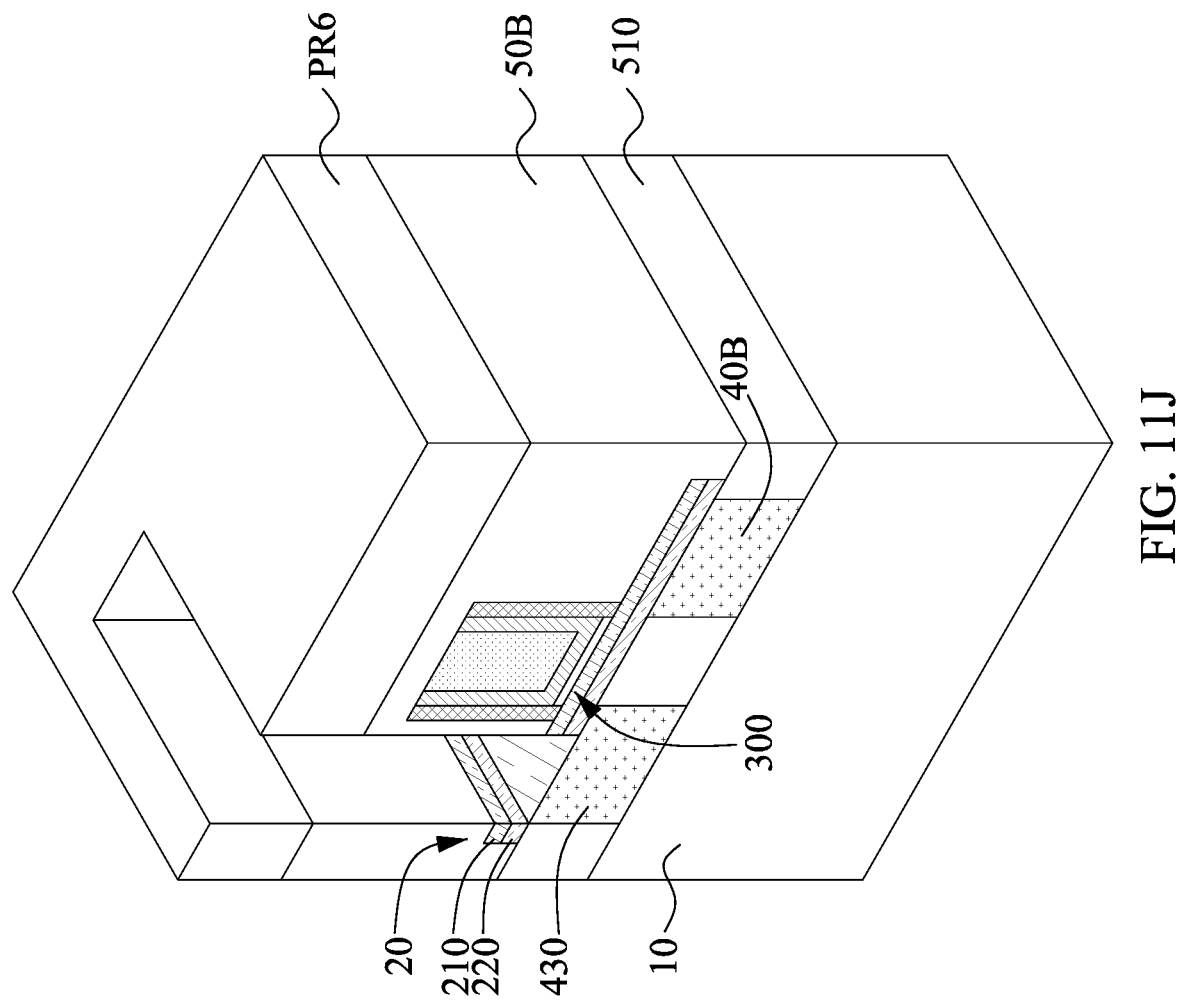

Referring to FIG. 11J, the n-type oxide semiconductor material 210B and the p-type oxide semiconductor material 220B may be patterned to form an opening (or a trench) exposing a portion of the conductive layer 430. In some embodiments, a photoresist PR6 may be used to pattern the passivation layer 50A, the n-type oxide semiconductor material 210B, and the p-type oxide semiconductor material 220B to form a passivation layer 50B, an n-type oxide semiconductor layer 210, and a p-type oxide semiconductor layer 220 which define the opening or trench.

Figure 11K:
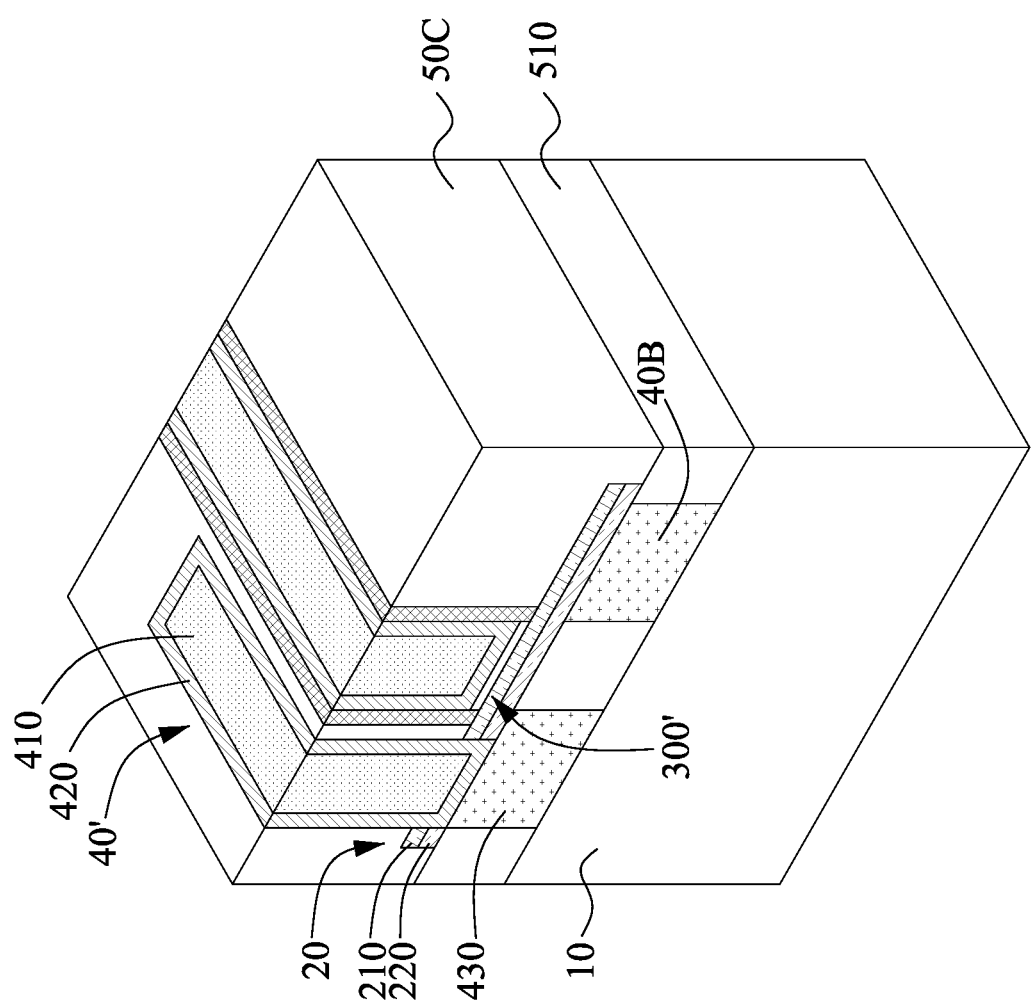

Referring to FIG. 11K, the photoresist PR6 may be removed, and a liner 420 and a conductive layer 410 may be formed on the exposed portion of the conductive layer 430. In some embodiments, the liner 420 and the conductive layer 410 are formed in the opening or trench. In some embodiments, a liner material and a conductive material may be formed in the opening or trench, and a planarization operation may be performed on the liner material and the conductive material to form the contact structure 40'. In some embodiments, the planarization operation is performed on the passivation layer 50B and the gate 300 to form a passivation layer 50C and a gate 300'.

Figure 11L:
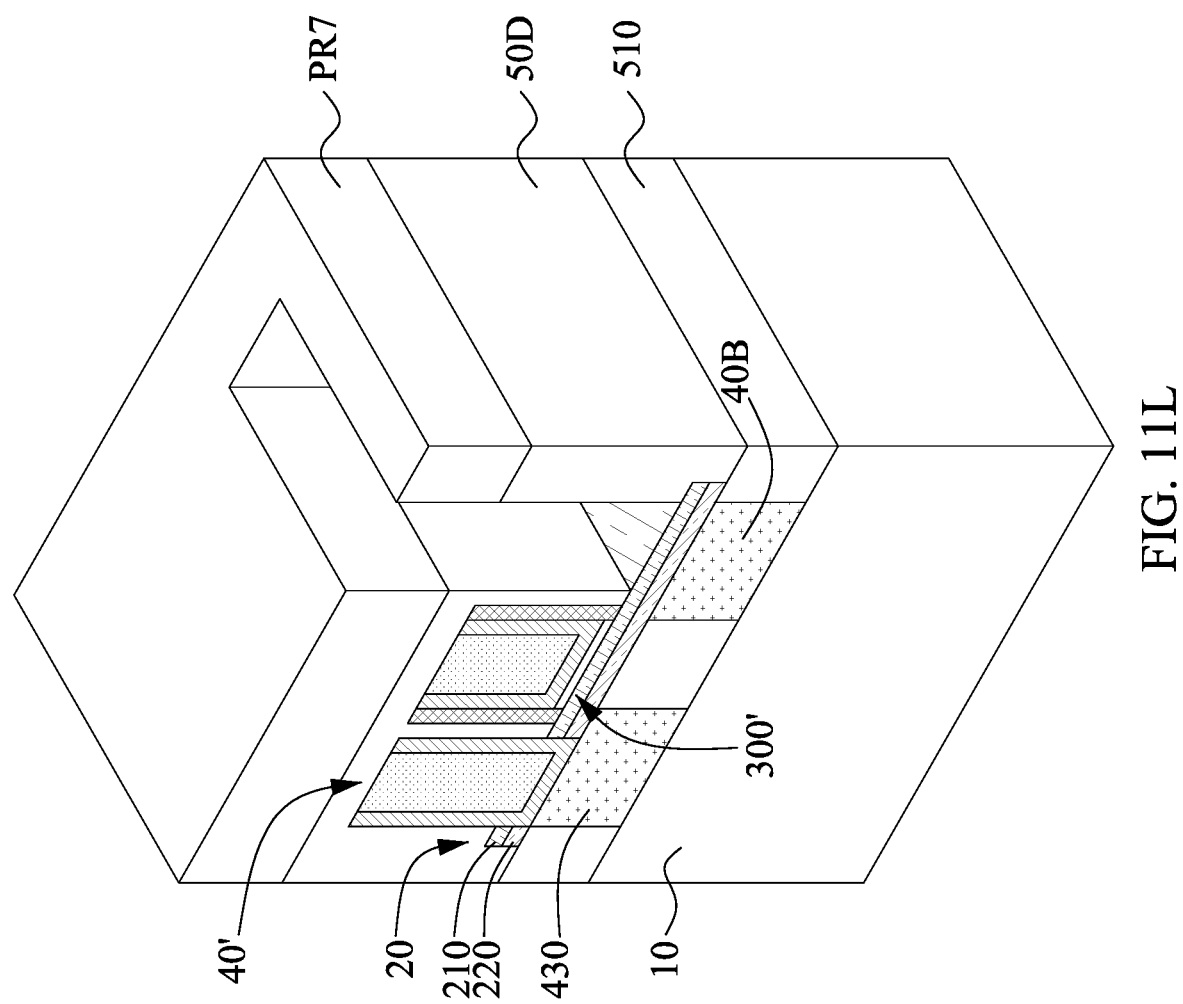

Referring to FIG. 11L, the passivation layer 50C may be patterned to form an opening (or a trench) exposing a portion of the n-type oxide semiconductor material 210. In some embodiments, a photoresist PR7 may be used to pattern the passivation layer 50C to form a passivation layer 50D which defines the opening or trench.

Referring to FIG. 11M, the photoresist PR7 may be removed, and a liner 420A and a conductive layer 410A may be formed on the exposed portion of the n-type oxide semiconductor material 210. In some embodiments, the liner 420A and the conductive layer 410A are formed in the opening or trench. In some embodiments, a liner material and a conductive material may be formed in the opening or trench, and a planarization operation may be performed on the liner material and the conductive material to form the contact structure 40A. In some embodiments, the planarization operation is performed to form a gate 30, and the planarized passivation layer together with the passivation layer 510 form a passivation layer 50. As such, the semiconductor device 4 illustrated in FIGS. 4A-4B is formed.

According to an embodiment, a semiconductor device includes an oxide semiconductor stack, a first gate, a first contact structure, and a second contact structure. The oxide semiconductor stack includes an n-type oxide semiconductor layer and a p-type oxide semiconductor layer stacked on each other. The first gate is over the oxide semiconductor stack. The first contact structure and the second contact structure are at opposite sides of the first gate and electrically connected to the oxide semiconductor stack.

According to an embodiment, a semiconductor device includes a multilayer channel, a first gate, a first contact structure, and a second contact structure. The multilayer channel includes an n-type channel layer and a p-type channel layer stacked on each other over a substrate. The first gate is over the multilayer channel. The first contact structure electrically connects to the n-type channel layer and the p-type channel layer. The second contact structure electrically connects to at least one of the n-type channel layer and the p-type channel layer.

According to an embodiment, a method of manufacturing a semiconductor device includes: forming a multilayer channel over a substrate; the multilayer channel comprising an n-type channel layer and a p-type channel layer stacked on each other; forming a gate over the multilayer channel; forming a first contact structure contacting the n-type channel layer and the p-type channel layer; and forming a second contact structure contacting at least one of the n-type channel layer and the p-type channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   an oxide semiconductor stack comprising an n-type oxide semiconductor layer and a p-type oxide semiconductor layer stacked on each other;
   a first gate over the oxide semiconductor stack;
   a first contact structure and a second contact structure at opposite sides of the first gate and electrically connected to the oxide semiconductor stack; and
   a third contact structure electrically connected to the p-type oxide semiconductor layer,
   wherein the first contact structure electrically connects to the n-type oxide semiconductor layer and the p-type oxide semiconductor layer, and the second contact structure electrically connects to the n-type oxide semiconductor layer.

2. The semiconductor device according to claim 1, wherein the n-type oxide semiconductor layer is electrically isolated from the p-type oxide semiconductor layer.

3. The semiconductor device according to claim 2, wherein the oxide semiconductor stack further comprises an insulating barrier stacked between and in contact with the n-type oxide semiconductor layer and the p-type oxide semiconductor layer.

4. The semiconductor device according to claim 1, wherein at least one of the first contact structure and the second contact structure extends into the oxide semiconductor stack.

5. The semiconductor device according to claim 1, further comprising a second gate, wherein the first gate and the second gate are over opposite surfaces of the oxide semiconductor stack.

6. The semiconductor device according to claim 1, further comprising
   a fourth contact structure, wherein the fourth contact structure and the first gate are at opposite sides of the oxide semiconductor stack,
   wherein the fourth contact structure electrically connects to the p-type oxide semiconductor layer.

7. The semiconductor device according to claim 1, wherein the first contact structure penetrates the n-type oxide semiconductor layer and the p-type oxide semiconductor layer.

8. The semiconductor device according to claim 1, wherein the oxide semiconductor stack further comprises an insulating barrier stacked between and in contact with the n-type oxide semiconductor layer and the p-type oxide semiconductor layer, and the first contact structure penetrates the insulating barrier.

9. A semiconductor device, comprising:
   a multilayer channel over a substrate, and the multilayer channel comprising an n-type channel layer and a p-type channel layer stacked on each other, wherein the n-type channel layer is electrically isolated from the p-type channel layer;
   a first gate over the multilayer channel, wherein the multilayer channel is positioned between the substrate and the first gate;
   a first contact structure electrically connected to the n-type channel layer and the p-type channel layer;

a second contact structure at least electrically connected to the n-type channel layer; and a third contact structure electrically connected to the p-type channel layer.

10. The semiconductor device according to claim 9, wherein the first contact structure and the second contact structure are source/drain contacts and electrically connected to the n-type channel layer and the p-type channel layer.

11. The semiconductor device according to claim 9, wherein the second contact structure and the third contact structure are at opposite sides of the multilayer channel.

12. The semiconductor device according to claim 9, further comprising:

a second gate over the multilayer channel; and a fourth contact structure electrically connected to the n-type channel layer and the p-type channel layer, wherein the first gate electrically connects to the fourth contact structure, and the second gate electrically connects to the first contact structure.

13. The semiconductor device according to claim 12, wherein the first contact structure and the fourth contact structure penetrate the multilayer channel.

14. The semiconductor device according to claim 9, wherein the multilayer channel further comprises an insulating barrier electrically isolating the n-type channel layer from the p-type channel layer.

15. The semiconductor device according to claim 9, wherein a portion of a lateral surface of the first contact structure directly contacts the n-type channel layer and the p-type channel layer.

16. The semiconductor device according to claim 9, wherein the first contact structure comprises a first conductive layer, a liner surrounding the first conductive layer, and a second conductive layer electrically connecting the liner and the first conductive layer.

17. A method of manufacturing a semiconductor device, comprising:

forming a multilayer channel over a substrate, the multilayer channel comprising an n-type channel layer and a p-type channel layer stacked on each other, wherein forming the multilayer channel comprises depositing an n-type oxide semiconductor material and a p-type oxide semiconductor material stacked on each other;

forming a gate over the multilayer channel;

forming a first contact structure contacting the n-type channel layer and the p-type channel layer; and forming a second contact structure contacting at least one of the n-type channel layer and the p-type channel layer.

18. The method according to claim 17, wherein the first contact structure penetrates the n-type oxide semiconductor material and the p-type oxide semiconductor material.

19. The method according to claim 17, wherein forming the first contact structure comprises:

patterning the n-type oxide semiconductor material and the p-type oxide semiconductor material to form an opening exposing a portion of the substrate; and forming the first contact structure on the portion of the substrate.

20. The method according to claim 17, wherein forming the multilayer channel comprises:

forming an insulating barrier stacked between and in contact with the n-type oxide semiconductor material and the p-type oxide semiconductor material.

* * * * *